(12) United States Patent
Ferrasse et al.

(10) Patent No.: US 10,900,102 B2
(45) Date of Patent: Jan. 26, 2021

(54) HIGH STRENGTH ALUMINUM ALLOY BACKING PLATE AND METHODS OF MAKING

(71) Applicant: Honeywell International Inc., Morris Plains, NJ (US)

(72) Inventors: Stephane Ferrasse, Spokane, WA (US); Frank C. Alford, Spokane Valley, WA (US); Michael R. Pinter, Spokane, WA (US); Susan D. Strothers, Mead, WA (US)

(73) Assignee: Honeywell International Inc., Charlotte, NC (US)

( * ) Notice: Subject to any disclaimer, the term of this patent is extended or adjusted under 35 U.S.C. 154(b) by 456 days.

(21) Appl. No.: 15/705,989

(22) Filed: Sep. 15, 2017

(65) Prior Publication Data
US 2018/0094340 A1 Apr. 5, 2018

Related U.S. Application Data

(60) Provisional application No. 62/402,267, filed on Sep. 30, 2016.

(51) Int. Cl.
*C23C 14/35* (2006.01)
*C22C 21/08* (2006.01)
(Continued)

(52) U.S. Cl.
CPC ............ *C22C 21/08* (2013.01); *B21C 23/001* (2013.01); *B21J 5/002* (2013.01); *C22C 1/026* (2013.01);
(Continued)

(58) Field of Classification Search
CPC .................................................. H01J 37/3435
See application file for complete search history.

(56) References Cited

U.S. PATENT DOCUMENTS

| 4,626,409 A | 12/1986 | Miller |
| 4,869,751 A | 9/1989 | Zedalis et al. |

(Continued)

FOREIGN PATENT DOCUMENTS

| CN | 101374611 A | 2/2009 |
| CN | 101801565 A | 8/2010 |

(Continued)

OTHER PUBLICATIONS

Ahmad, Zaki. "The Properties and Application of Scandium-Reinforced Aluminum." Journal of the Minerals, Feb. 2003, pp. 35-39.
(Continued)

*Primary Examiner* — Jason Berman
(74) *Attorney, Agent, or Firm* — Faegre Drinker Biddle & Reath LLP

(57) ABSTRACT

A method of forming a high strength aluminum alloy. The method comprises heating an aluminum material including scandium to a solutionizing temperature of the aluminum material such that scandium is dispersed throughout the aluminum material to form an aluminum alloy. The method further comprises extruding the aluminum alloy with equal channel angular extrusion to form a high strength aluminum alloy, such that the high strength aluminum alloy has a yield strength greater than about 40 ksi after being at a temperature from about 300° C. to about 400° C. for at least one hour.

19 Claims, 24 Drawing Sheets

(51) Int. Cl.

| | | |
|---|---|---|
| | *C22F 1/047* | (2006.01) |
| | *C23C 14/34* | (2006.01) |
| | *H01J 37/34* | (2006.01) |
| | *C22F 1/00* | (2006.01) |
| | *C22C 1/02* | (2006.01) |
| | *B21C 23/00* | (2006.01) |
| | *B21J 5/00* | (2006.01) |

(52) U.S. Cl.
CPC .............. *C22F 1/002* (2013.01); *C22F 1/047* (2013.01); *C23C 14/3407* (2013.01); *H01J 37/3435* (2013.01)

(56) References Cited

U.S. PATENT DOCUMENTS

| | | |
|---|---|---|
| 5,087,297 A | 2/1992 | Pouliquen |
| 5,143,590 A | 9/1992 | Strothers et al. |
| 5,342,496 A | 8/1994 | Stellrecht |
| 5,400,633 A | 3/1995 | Segal et al. |
| 5,597,529 A | 1/1997 | Tack |
| 5,766,380 A | 6/1998 | Lo et al. |
| 5,807,443 A | 9/1998 | Masuda et al. |
| 5,809,393 A | 9/1998 | Dunlop et al. |
| 5,979,534 A | 11/1999 | Shibata et al. |
| 6,094,815 A | 8/2000 | Shigihara et al. |
| 6,238,494 B1 | 5/2001 | Segal |
| 6,348,139 B1 | 2/2002 | Shah et al. |
| 6,451,185 B2 | 9/2002 | Beier et al. |
| 6,517,954 B1 * | 2/2003 | Mergen ................. B32B 15/012 148/437 |
| 6,569,270 B2 | 5/2003 | Segal |
| 6,698,647 B1 * | 3/2004 | Kim ..................... B23K 20/021 204/298.12 |
| 6,849,139 B2 | 2/2005 | Kardokus et al. |
| 6,878,250 B1 | 4/2005 | Segal et al. |
| 6,946,039 B1 | 9/2005 | Segal et al. |
| 7,017,382 B2 | 3/2006 | Segal et al. |
| 7,767,043 B2 | 8/2010 | Segal et al. |
| 8,231,745 B2 | 7/2012 | Wickersham, Jr. et al. |
| 8,974,611 B2 | 3/2015 | Carpenter et al. |
| 2001/0047838 A1 | 12/2001 | Segal et al. |
| 2003/0052000 A1 | 3/2003 | Segal et al. |
| 2004/0072009 A1 | 4/2004 | Segal et al. |
| 2005/0247386 A1 | 11/2005 | Matera et al. |
| 2005/0284746 A1 | 12/2005 | Ivanov |
| 2011/0302979 A1 | 12/2011 | Oppenheimer et al. |
| 2014/0271337 A1 | 9/2014 | Banik et al. |
| 2018/0223420 A1 | 8/2018 | Ferrasse et al. |

FOREIGN PATENT DOCUMENTS

| | | |
|---|---|---|
| CN | 103255381 A | 8/2013 |
| CN | 104451566 A | 3/2015 |
| EP | 0370211 A2 | 5/1990 |
| EP | 0881311 A1 | 12/1998 |
| EP | 2706129 A1 | 3/2014 |
| GB | 2276429 A | 9/1994 |
| JP | 60148651 A | 8/1985 |
| JP | 6226426 A | 8/1994 |
| JP | 2001295040 A | 10/2001 |
| JP | 2014214827 A | 11/2014 |
| JP | 2015096647 A | 5/2015 |
| JP | 2015183244 A | 10/2015 |
| KR | 865658 B1 | 10/2008 |
| KR | 20120135546 A | 12/2012 |
| KR | 20140015367 A | 2/2014 |
| KR | 101499096 B1 | 3/2015 |
| RU | 2453626 C2 | 6/2012 |
| WO | WO9902743 A1 | 1/1999 |
| WO | WO0073531 A2 | 12/2000 |
| WO | WO0194659 A2 | 12/2001 |
| WO | 2005094280 A2 | 10/2005 |
| WO | 2017014990 A1 | 1/2017 |

OTHER PUBLICATIONS

Berezina, A.L.; et al. "A Comparative Analysis of Effectiveness of Al3Sc and Al3Zr Species in Al—Mg Alloys." Met. Phys. Adv. Tech., 17:1021-1034, 1999.

Du, Gang; et al. "Coarsening Behavior of Al3(Sc,Zr) Precipitates and its Influence of Recrystallization Temperature of Al—Mg—Sc—Zr Alloy." J. Mater. Sci. Technol., 25(6):749-752, 2009.

Ferrasse, S.; et al. "Texture Evolution During Equal Channel Angular Extrusion Part I. Effect of Route, Number of Passes and Initial Texture." Materials Science and Engineering A, 368:28-40, Mar. 15, 2004.

Ferrasse, Stephane. "Development of a Submicrometer-Grained Microstructure in Aluminum 6061 using equal channel Angular Extrusion." Journal of Materials Research, 12(5):1253-1261, May 1997.

Ferrasse, Stephane; et al. "Microstructure and Properties of Copper and Aluminum Alloy 3003 Heavily Worked by Equal Channel Angular Extrusion." Metallurgical and Materials Transactions A, 28A:1047-1057, Apr. 1997.

Ferrasse, Stephane; et al. "Scale Up and Application of Equal-Channel Angular Extrustion for the Electronics and Aerospace Industries." Materials Science A, 493:130-140, Oct. 15, 2008.

International Preliminary Report on Patentability issued in PCT/US2016/043997, dated Feb. 15, 2018, 10 pages.

International Search Report and Written Opinion issued in PCT/US2016/043997, dated Jul. 26, 2016, 14 pages.

International Search Report and Written Opinion issued in PCT/US2017/052217, dated Jan. 10, 2018, 14 pages.

Kaibyshev, Rustam. "Mechanism of Low-Temperature Superplastic Deformation in Aluminum Alloys Containing a Dispersion of Nanoscale Al3(Sc,Zr) Particles." Materials Science Forum, 838-839:150-156, 2016; International Conference on Superplasticity in Advanced Materials, ICSAM 2015.

Kim, Jong Ho; et al. "Electromagnetic Continuous Casting Process for Near Net Shape Aluminum Alloy Billet." Materials Science Forum, vols. 654-656:1400-1403, 2010.

Kim, W.J.; et al. "Forging of Mg—3Al—1Zn—1Ca Alloy Prepared by High-Frequency Electromagnetic Casting." Materials and Design, 30:4120-4125, 2009.

Qu, Fu; et al. "Effects of Electromagnetic Field and Lubricate Condition on the Surface Quality of Aluminum Alloy Billet During LFEC Processing." Applied Mechanics and Materials, vols. 268-270:378-381, 2013.

Vlach, M; et al. "Microstructure, Thermal and Mechanical Properties of Non-Isothermally Annealed Al—Sc—Zr and Al—Mn—Sc—Zr Alloys Prepared by Powder Metallurgy." Acta Physica Polonica A, 122(3):439-443, 2012.

Yoneta; et al. "Advantageous Characteristics of Graphite Free Forging Lubricants to Environmentally Friendly Work Space." 2009 STLE Annual Meeting & Exhibition; May 17-21, 2009; Disney's Coronado Springs Resort; Orlando, Florida, USA; pp. 264-266.

Yuzbekova, Diana; et al. "Superplasticity of Ultrafine-Grained Al—Mg—Sc—Zr Allow." Materials Science & Engineering A 675:228-242, 2016.

Extended European Search Report issued in EP Application 16833529.7, dated Dec. 6, 2018, 11 pages.

X R Li et al., "Effects of thermomechanical processing on the recrystallization texture and grain size of Al-1%Si sputtering target material", IOP Conference Series: Materials Science and Engineering, vol. 82, Apr. 24, 2015, 012065, 5 pages.

Singaporean Search Report and Written Opinion issued in SG Application No. 11201800859T, dated Jun. 19, 2019, 9 pages.

"Standard Hardness Conversion Tables for Metals Relationship Among Brinell Hardness, Vickers Hardness Rockwell Hardness, Superficial Hardness, Knoop Hardness, and Scleroscope Hardness", ASTM International Standard, ASTM International, US, Feb. 1, 2002, pp. 1-21.

International Preliminary Report on Patentability received for PCT Patent Application No. PCT/US2017/052217, dated Apr. 11, 2019, 11 pages.

(56) References Cited

OTHER PUBLICATIONS

Vinogradov et al., Fatigue life of fine-grain Al—Mg—Sc alloys produced by equal-channel angular pressing, Materials Science and Engineering: A, vol. 349, No. 1-2, Feb. 6, 2003, pp. 318-326.
Watanabe et al., "Effect of Annealing on High-Cycle Fatigue of an Al—Mg—Sc Alloy Produced by Equal-Channel Angular Pressing", Journal of the society of materials science graduate school of natural sci. Kanazawa Univ., vol. 55, No. 9, Sep. 30, 2006 pp. 837-842.

* cited by examiner

HIGH STRENGTH ALUMINUM ALLOY BACKING PLATE AND METHODS OF MAKING

CROSS REFERENCE TO RELATED APPLICATIONS

This application claims priority to U.S. Provisional Patent Application Ser. No. 62/402,267, filed Sep. 30, 2016, the disclosure of which is hereby expressly incorporated by reference herein in its entirety.

TECHNICAL FIELD

The present disclosure relates to high-strength aluminum alloys which may be used, for example, in sputtering target assemblies. More particularly, the present disclosure relates to high-strength aluminum alloys that are thermally stable and which may be used as backing plates in sputtering target assemblies. Methods of forming high-strength aluminum alloys, high-strength backing plates, and target assemblies are also described.

BACKGROUND

Physical vapor deposition ("PVD") methodologies are used extensively for forming thin films of material over a variety of substrates. Various metals and alloys can be deposited using PVD technology, including for example aluminum (Al), titanium (Ti), copper (Cu), tantalum (Ta), nickel (Ni), molybdenum (Mo), gold (Au), silver (Ag), Platinum (Pt) and alloys of these elements. In one PVD process, known as sputter deposition or sputtering, particles are ejected from the surface of a sputtering target by bombardment with gas ions, such as plasma. Thus, the sputtering target is the source for material which is deposited onto a substrate, such as a semiconductor wafer.

A diagrammatic view of a portion of an exemplary sputtering assembly 10 is shown in FIG. 1. A sputtering assembly 10 comprises a backing plate 12 having a sputtering target 14 bonded thereto. A semiconductive material wafer 18 is within the assembly 10 and provided to be spaced from a sputtering surface 16 of target 14. In operation, particles or sputtered material 22 is displaced from surface 16 of target 14 and used to form a coating (or thin film) 20 on wafer 18. It is to be understood that the sputtering assembly 10 depicted in FIG. 1 is an example configuration since, for example, both the target and the backing plate can be any suitable size or shape.

Sputtering targets may be coupled or attached to a backing plate. The backing plate may support the sputtering target during the sputtering process and may reduce, for example, warping of the sputtering target. One method of attaching a sputtering target to a backing plate is hot isotactic pressing ("HIPing," or "hipping"). Hipping may be used to bond the sputtering target to a backing plate by pressing the sputtering target and backing plate together after heating to a hipping temperature.

In some embodiments, backing plate 12 may have a high mechanical strength including, for example, a high Young modulus (E) and a high yield tensile strength (YS); a coefficient of thermal expansion comparable to that of the target material; good thermal conductivity; and electrical and magnetic properties similar to the target material.

The yield strength or Young's modulus determines the stress at which a specific amount of plastic deformation is produced in a material. Having a coefficient of thermal expansion comparable to that of the sputtering target material reduces the risk that the backing plate 12 and sputtering target 14 will debond during sputtering. Good thermal conductivity improves cooling efficiency. Having electrical and magnetic properties similar to the target material optimizes the magnetic and electrical fluxes through a sputtering assembly 10 during sputtering.

Advances in semiconductor wafer fabrication technology have led to a demand for increasingly large targets, especially for fabrication of 300 mm to 450 mm size wafers. Larger target sizes in turn require higher strength backing plate materials to minimize or avoid target warping. Although improvements have been made in backing plate materials, increasingly stronger materials are needed to provide sufficient strength for supporting larger target dimensions, especially in view of the increasingly high sputtering power being used to improve throughput, film quality, and uniformity.

Backing plates are currently formed most often from aluminum, copper, aluminum alloys and copper alloys. Whereas Cu alloys offer high strength and thermal stability, Al alloys have the advantage of being less expensive and lighter in weight. However, most commercial Al alloys lose peak strength around hipping temperatures, which are usually greater than 250° C., and often closer to 300° C. There is thus a need for a high strength backing plate having high temperature stability and yield strength.

SUMMARY

Disclosed herein is a method of forming a high strength aluminum alloy. The method comprises heating an aluminum material including scandium to a solutionizing temperature of the aluminum material such that scandium is dispersed throughout the aluminum material to form an aluminum alloy. The method further comprises extruding the aluminum alloy with equal channel angular extrusion to form a high strength aluminum alloy, such that the high strength aluminum alloy has a yield strength greater than 40 ksi after being at a temperature from about 300° C. to about 400° C. for at least one hour. In some embodiments, the method further comprises aging the high strength aluminum alloy at a temperature from about 300° C. to about 400° C. for at least one hour such that at least a portion of the scandium forms dispersoids throughout the high strength aluminum alloy.

Also disclosed herein is a method of forming an aluminum alloy for use in a sputtering assembly backing plate. The method comprises adding scandium to molten aluminum to form an aluminum material and casting the aluminum material. The method further comprises heating the aluminum material to a temperature from about 500° C. to about 650° C. for about 8 hours to about 120 hours, such that at least a portion of the scandium is dissolved throughout the aluminum material to form an aluminum alloy and quenching the aluminum alloy, such that the scandium remains dissolved throughout the aluminum alloy. The method further comprises subjecting the aluminum alloy to equal channel angular extrusion to form a high strength aluminum alloy; and aging the aluminum at a temperature from about 300° C. to about 400° C. for at least one hour so that at least a portion of the scandium forms dispersoids throughout the high strength aluminum alloy. The high strength aluminum alloy has a yield strength greater than 40 ksi after being at a temperature from about 300° C. to about 400° C. for at least one hour.

Also disclosed herein is a sputtering assembly comprising a backing plate comprising an aluminum alloy. The aluminum alloy comprises an aluminum material forming a metal matrix with aluminum as the primary component and containing scandium present at a weight percentage from about 0.1 wt. % to about 15.0 wt. % by weight of the aluminum alloy. At least a portion of the scandium forms dispersoids that are distributed throughout the aluminum alloy; and the aluminum alloy has a yield strength of at least 40 ksi after the aluminum alloy has been at a temperature from about 300° C. to about 400° C. for at least one hour.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

DETAILED DESCRIPTION

Figure 1:
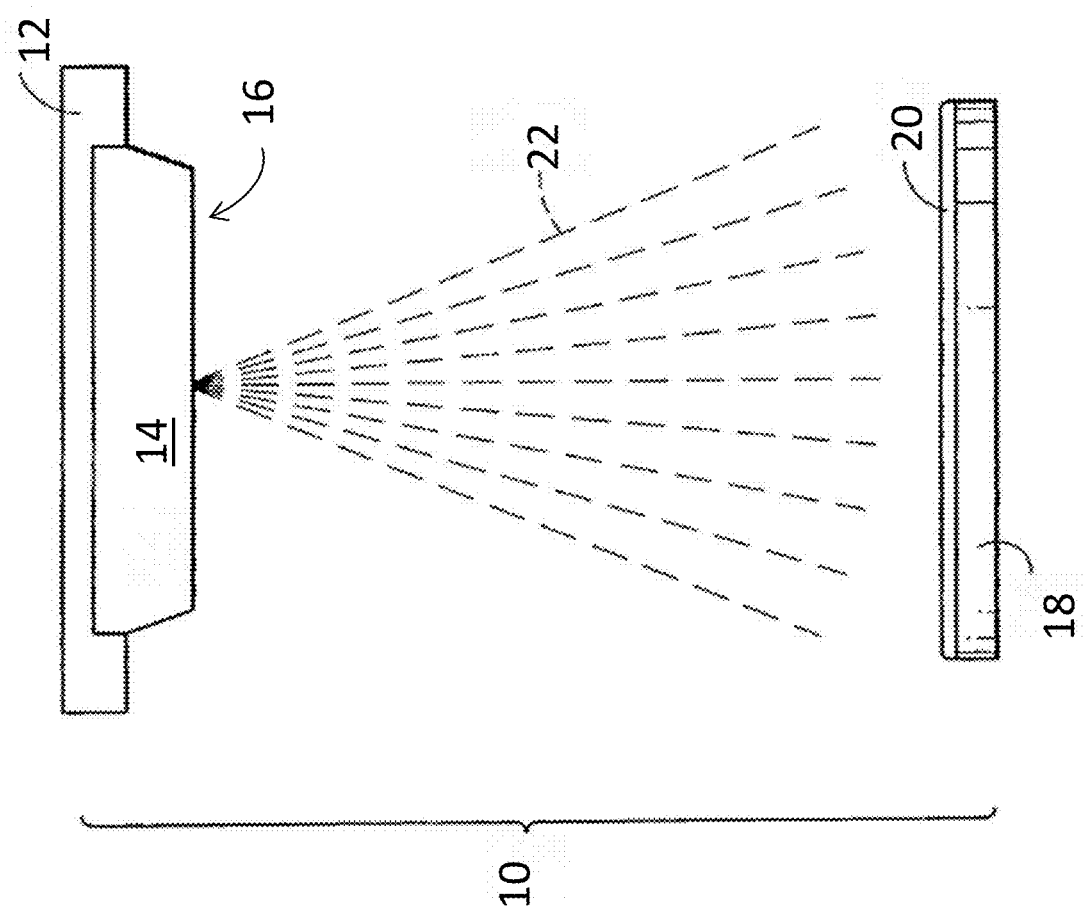
FIG. 1 is a diagrammatic view of a portion of a physical vapor deposition apparatus.

Disclosed herein is an aluminum (Al) alloy backing plate that has high strength and thermal stability and methods of making the same. More particularly, described herein is an Al alloy backing plate that has a yield strength greater than 40 ksi and/or a grain size less than about 1 micron in diameter after the backing plate has been at a temperature from about 300° C. to about 400° C. for at least one hour. In other embodiments, the Al alloy may have a yield strength from about 40 ksi to about 50 ksi or from about 40 ksi to about 65 ksi after the backing plate has been at a temperature from about 300° C. to about 400° C. for at least one hour. In some embodiments, the Al alloy backing plate contains scandium (Sc), and may, for example, include dispersoids containing Sc and Al. In some embodiments, the Al alloy backing plate may contain Sc and zirconium (Zr), and may form dispersoids containing Al and Sc and/or Zr. Methods of forming a high strength Al alloy including by equal channel angular extrusion (ECAE) are also disclosed.

The Al alloy includes a metal matrix formed from Al, dispersoids distributed throughout the metal matrix, and optionally additional elements. The metal matrix is formed from Al. That is, the metal matrix is formed with Al as the primary component. For example, a starting material may be high purity Al and trace elements. In some embodiments, Al alloys may also be used to make the metal matrix. Suitable Al alloys that may be used as a starting material for forming the metal matrix include Al5083 and Al5456.

A metal matrix is a material body that is formed of metal atoms of the primary component arranged into a crystal structure. That is, an Al metal matrix contains Al atoms arranged into a crystal structure. The metal matrix may be a completely pure or highly pure metal that forms the base crystal structure of a material body. Into the metal matrix crystal structure, additives may be introduced. If an additive or additives are present in the metal matrix at low enough concentrations, the additive or additives may be dispersed throughout the metal matrix such that individual atoms of the additive or additives are spread throughout the crystal structure, either between the atoms of the primary component that forms the matrix or by replacing the atoms of the primary component.

The Al alloy having a high yield strength has a concentration of Sc and/or additional additives suitable to form dispersoids throughout the Al matrix. Dispersoids are finely divided particles of a second substance distributed or dispersed in a first substance. In metallurgy, dispersoids may be formed from Al in combination with certain elements such as Sc. In some embodiments, the Al alloy contains dispersoids formed of Al in combination with at least one material in the Al at a weight percentage of from about 0.05 wt. % to about 20 wt. % of the total weight of the Al alloy. In some embodiments, the material added to the Al may be chromium (Cr), Iron (Fe), hafnium (Hf), manganese (Mn), niobium (Nb), nickel (Ni), scandium (Sc), titanium (Ti), vanadium (V), zirconium (Zr), yttrium (Y), lithium (Li), tantalum (Ta), molybdenum (Mo), or elements in the lanthanide series of the periodic table (i.e., landthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thalium (Tm), ytterbium (Yb), and lutetium (Lu)). For example, suitable dispersoids may have the formula $Al_nX$ where "n"≥3 and X is at least one of Cr, Fe, Hf, Mn, Nb, Ni, Sc, Ti, V, Zr, Y, Li, Ta, Mo, La, Ce, Pr, Nd, Pm, Sm, Eu, Gd, Tb, Dy, Ho, Er, Tm, Yb, or Lu. It is also possible to have several X elements present in a dispersoid, for example a dispersoid can be of the form $Al_n(X1, X2)_m$, where "n" and "m" are positive integers, X1 and X2 are elements taken from the list above, and a ratio of "n" to "m" is ≥3. Every X element will have a specific $Al_nX_m$ composition, where the ratio of "n" to "m" will be the highest possible (e.g. it will be the phase that has the maximum Al content and is the first one to form when there is a low concentration of element X in the Al alloy). The Al alloy may include dispersoids formed of Al in combination with Sc and at least one of Cr, Fe, Hf, Mg, Mn, Nb, Ni, Ti, V, Zr, Y, Li, Ta, Mo, La, Ce, Pr, Nd, Pm, Sm, Eu, Gd, Tb, Dy, Ho, Er, Tm, Yb, or Lu that is present at a weight percentage from about 0.1 wt. % to about 1.0 wt. % in the Al alloy. In some embodiments, in addition to the dispersoids containing Sc, the Al alloy may also include dispersoids formed from oxides, silicides and carbides (e.g. graphene, nanotubes) that may be added during melting.

In some embodiments, a stable primary phase or stable primary particle may be material having the formula $Al_n(X)_m$ where "n" and "m" are positive integers and X is at least one of Cr, Fe, Hf, Mn, Nb, Ni, Sc, Ti, V, Zr, Y, Li, Ta, Mo, La, Ce, Pr, Nd, Pm, Sm, Eu, Gd, Tb, Dy, Ho, Er, Tm, Yb, or Lu. Typically, $Al_n(X)_m$ forms during cooling of the molten alloy during casting and when the concentration of X elements is above the maximum solubility of that element in the aluminum matrix for the given composition and process conditions of melting and cooling. Note that a primary phase may be a phase that forms during the melting and cooling process and remains stable during subsequent heat treatments at temperatures below the Al alloy melting point. In contrast, a secondary phase (sometimes also referred to as a precipitate or secondary particle) is formed during subsequent heat treatments such as solutionizing, quenching or low temperature aging (described further below).

A suitable concentration of dispersoids may increase the strength of the Al alloy as compared to the same Al alloy without the dispersoids. In some embodiments, a low concentration of dispersoids may be enough to increase the strength of the Al alloy compared to the same Al alloy without dispersoids. The low concentration requirements may be particularly beneficial when the dispersoids include elements, such as Sc or rare earth elements that may have limited availability. In some embodiments, the dispersoids are coherent with the Al metal matrix. That is, there may be a small lattice mismatch within the Al lattice when the dispersoids are the smallest.

In some embodiments, the stability of the submicron structure of an Al alloy may be quantified by various methods including by measuring the sizes of the grains of the alloy or particles containing dispersoids. In some embodiments, adding Sc to Al alloy inhibits the Al alloy from recrystallizing into larger grains. In some embodiments, fine and uniform sized grains in an Al alloy and/or particles containing dispersoids in an Al alloy are one predictor of the Al alloy yield strength. In some embodiments, an Al alloy that maintains a fine and uniform grain size up to a particular temperature is predicted to maintain a high yield strength at that particular temperature.

It has been found that certain elements that are added into Al alloys form dispersoids with the Al that contribute to the strength of the Al alloy and contribute to making the submicron structure thermally stable up to hipping temperatures of between about 300° C. to about 400° C., and more particularly about 300° C. to about 350° C.

In some embodiments, combining the addition of dispersoids into an Al alloy with severe plastic deformation, a high strength Al alloy suitable for backing plates and backing plate materials can be formed. One suitable severe plastic deformation process is equal channel angular extrusion (ECAE). In some embodiments, an optimum number of ECAE passes may include at least one pass, and in some embodiments up to four passes. In some embodiments, severe plastic deformation of Al alloys provides suitable yield strengthening to Al alloys and also make the submicron structure thermally stable up to hipping temperatures from about 300° C. to about 400° C., or from about 300° C. to about 350° C. In some embodiments, higher yield strengths and Brinell hardness can be attained by combining severe plastic deformation such as ECAE with the strength provided by plastic deformation such as by rolling and/or forging.

The Al alloy may optionally include certain transition elements. Suitable transition elements may include Fe, Cu, Zn, Co, Ni, Cr, Mo, V, Zr, Mn, Mg, Ti, Y, Si, Li, boron (B), lead (Pb), bismuth (Bi) in concentrations greater than 0.5 wt. %, greater than 3.0 wt. %, greater than 5.0 wt. %. Al alloys including Sc and an additional transition element may contribute to improved strength as compared to an Al alloy that does not include the Sc and transition element, or that includes Sc but does not include the transition element. In addition to adding dispersoids, heavy alloying using transition elements may contribute to improved strength and thermal stability. The transition elements may be present as solutes (e.g. interstitial or substitutional atoms in the solid solution) in the Al matrix or form either insoluble phases during melting and cooling or soluble secondary phases during subsequent heat treatments after the initial melting and cooling.

During the alloying process, Sc forms $Al_3Sc$ dispersoids in an Al matrix with a specific $Ll_2$ crystal structure that has a lattice parameter close to that of Al. The temperature range for precipitation hardening of $Al_3Sc$ dispersoids is 275° C. to 350° C. with peak strength properties around 300° C. In contrast, conventional elements used for precipitation hardening in commercial Al alloys, have a lower temperature range for precipitation of 85° C. to 200° C. It has been found that peak aging of $Al_3Sc$ dispersoids is realized at about 300° C. after at least one hour, and that the dispersoids remain stable at about these temperatures for greater than one hour, greater than 8 hours, or greater than 24 hours. Temperatures lower than 275° C. do not provide enough energy to distribute a suitable amount of $Al_3Sc$ dispersoids throughout the Al alloy to significantly increase strength, and at temperatures above 350° C., $Al_3Sc$ dispersoids start to gather and coalesce to form large precipitates or form larger dispersoids with sizes larger than 100 nm in diameter. Increasing the temperature above 400° C. eventually grows the size of dispersoid particle above 1 micron in diameter, which results in a material that is too coarse and has diminished mechanical benefits.

Other elements that form dispersoids in Al include Cr, Fe, Hf, Mn, Nb, Ni, Ti, V, Zr, Y, Li, Ta, Mo, La, Ce, Pr, Nd, Pm, Sm, Eu, Gd, Tb, Dy, Ho, Er, Tm, Yb, and Lu. In some embodiments, these elements can combine with Al and Sc to form dispersoids with a more complex composition. For example, adding Zr to an Al material containing Sc forms an Al alloy having dispersoids with the form $Al_3(Sc,Zr)$ to form a dispersoid core richer in Sc and an outside surface (also referred to as a shell) richer in Zr. In some embodiments, this core/shell structure may be used to describe $Al_3(Sc,Zr)$ dispersoids. In some embodiments, Sc diffusion through the Al material controls the early nucleation and growth of $Al_3Sc$, and Zr may be combined to form the $Al_3(Sc,Zr)$ dispersoid at a later stage. This is explained by the much lower diffusivity of Zr in Al compared to Sc and leads to a core/shell structure where the nucleation and initial growth of the $Al_3Sc$ core is controlled by Sc diffusion, and the late growth and coarsening stage of the $Al_3(Sc,Zr)$ shell is controlled by Zr diffusion. This type of core/shell $Al_3(Sc,Zr)$ structure can have advantages for dispersoid control by providing more stable and finer dispersoids.

In some embodiments, the Al alloy includes dispersoids formed of Al in combination with two or more elements and the peak aging temperature and time for optimized grain sizes and grain size distribution remain between 275° C. and 350° C. for greater than 1 hour, greater than 8 hours, or greater than 24 hours. In some embodiments, Al alloys containing dispersoids formed of Al combined with Sc and one further element are particularly suitable for slowing grain size growth at temperatures greater than 300° C., greater than 350° C., and greater than 400° C. and may provide stable grain structures that contribute to thermal stability. Additional examples of dispersoids that can be formed include $Al_3(Zr, RE)$ where RE is a rare earth element, such as an element in the lanthanide series of the periodic table. As an example, Yb and Er may form $Al_3(Zr, Er)$ and $Al_3(Zr,Yb)$ dispersoids with high thermal stability that keep the Ll2 structure even at temperatures up to 500° C. It is also possible to stabilize ternary dispersoids with fourth-period transition elements such as Cr or Mn leading to the formation of $(Al, Cr)_3(Zr, Yb)$ dispersoids for example.

The maximum number of atoms of a second material that can be present in a first material without forming secondary phases, such as precipitating or coalescing out of the material matrix is called the maximum solubility and depends strongly on temperature. In general, the higher the temperature, the greater the maximum solubility of a given element. For example, the maximum solubility of Sc in Al at room temperature is less than 0.01 wt. % but may be as high as 0.38 wt. % near 660° C. (the solidus temperature of Al) at equilibrium conditions (e.g. after a sufficient amount of time). It is possible to control the maximum solubility of a second material (i.e. a certain element) in a first material by varying the temperature and/or the heating and cooling rate.

For standard metal castings, heat treatment of a cast piece is often carried out near the solidus temperature (i.e. solutionizing) of the cast piece, followed by rapidly cooling the cast piece by quenching the cast piece to room temperature. This process retains any elements dissolved into the cast piece at a higher concentration than the equilibrium concentration of that element in the Al alloy at room temperature. After quenching, the cast piece is said to be supersaturated with the second material and is in non-equilibrium at room temperature (i.e. a metastable state). The second material will tend to precipitate out of the cast piece into a new phase at much lower heat treat temperatures and time than those near solidus temperature (i.e. about 660° C. for Al). For Sc in Al, a maximum solubility of about 0.38 wt. % (0.23 at. %) can be retained in the supersaturated solution at room temperature by using high temperature treatment near the solidus and standard quenching in oil or water (low cooling rates). It is possible to attain a higher maximum solubility for a supersaturated solution by adjusting the casting process, for example using a faster cooling rate or techniques referred as "non-conventional casting" or "non-conventional ingot metallurgy."

If the amount of an element that forms a dispersoid in a material matrix is higher than the maximum solubility of that element, only the maximum soluble amount will enter solution during solutionizing and quenching and the excess amount of that element will remain in a stable primary phase. For example, if Sc is present in Al at greater than 0.38 wt. %, and standard casting and cooling methods are used, only 0.38 wt. % of Sc will enter solution during solutionizing and quenching. The excess Sc will remain unaffected and stay in the various stable primary phases (such as $Al_2Sc$) formed during melting and cooling. Particles formed of primary phases are typically fairly coarse (several microns in diameter), not evenly distributed, and can have a composition, lattice mismatch, and/or crystal structure different from $Al_3Sc$. The stable primary phases will not be affected by the subsequent heat treatments such as solutionizing, quenching, and low temperature aging at 300° C. Only the 0.38 wt. % Sc in solution will be affected by the heat treatment and form dispersoids. Thus, Sc present in excess in the primary phase will have a relatively low effect on the final strength of the Al alloy.

It is possible to add a high weight percentage of dispersoid-forming elements (for Sc, about 5 wt. % or about 15.0 wt. %, for example) and create a high number of individual coarse stable primary phase particles that contain the dispersoid-forming element and contribute additional strength to the Al alloy. However, in general, due to the limited availability of elements such as scandium and elements in the lanthanide series of the periodic table (La, Ce, Pr, Nd, Pm, Sm, Eu, Gd, Tb, Dy, Ho, Er, Tm, Yb, Lu), as well as the coarse size of the primary phases containing the excess amount of dispersoid-forming element, adding these elements in concentrations too much higher than their maximum solubility limit is not highly effective. Instead, to achieve maximum effectiveness for the amount added, it is more suitable to add an amount of the dispersoid-forming element close to the solubility limit of the particular dispersoid-forming element in the Al alloy.

Conventional thermo-mechanical processing provides an unsuitably low level of plastic deformation and results in coarse and inhomogeneous grain structures or second phases having sizes well over 1 micron. It has been found subjecting an Al alloy containing Sc-containing dispersoids to severe plastic deformation produces an Al alloy having increased strength.

Heightened Strengths Using Methods of Making Including Severe Plastic Deformation The instant disclosure contains methods of forming high strength Al by combining the addition of dispersoids into the metal matrix with severe plastic deformation. These methods have been found to provide Al alloys that have high enough yield strengths or Brinnell hardness to be suitable for use in backing plate material. In some embodiments, the form of severe plastic deformation used includes ECAE. The ECAE methods described herein can additionally be combined with standard plastic deformation to further increase the yield strength or Brinnell hardness of Al alloys. In some embodiments, the methods disclosed herein may include solution and/or precipitation hardening of the Al alloy having dispersoids as well as conventional precipitates. The instant disclosure also provides optimum thermal heat treatments that may be applied to sputtering target backing plate bonding applications.

In some embodiments, an Al alloy may be formed for backing plate material having yield strengths above 40 ksi, above 45 ksi, or above 50 ksi after the Al alloy has been at a temperature of at least 250° C. for at least one hour. These results can be obtained by combining the strength provided by plastic deformation such as by rolling and/or forging with severe plastic deformation such as ECAE. It has been discovered that an optimum number of ECAE passes may include at least one pass, and in some embodiments up to four passes. It has been found that using severe plastic deformation of Al alloys provides suitable yield strengthening to Al alloys and also make the submicron structure thermally stable up to hipping temperatures of between about 300° C. to about 350° C.

Figure 2:
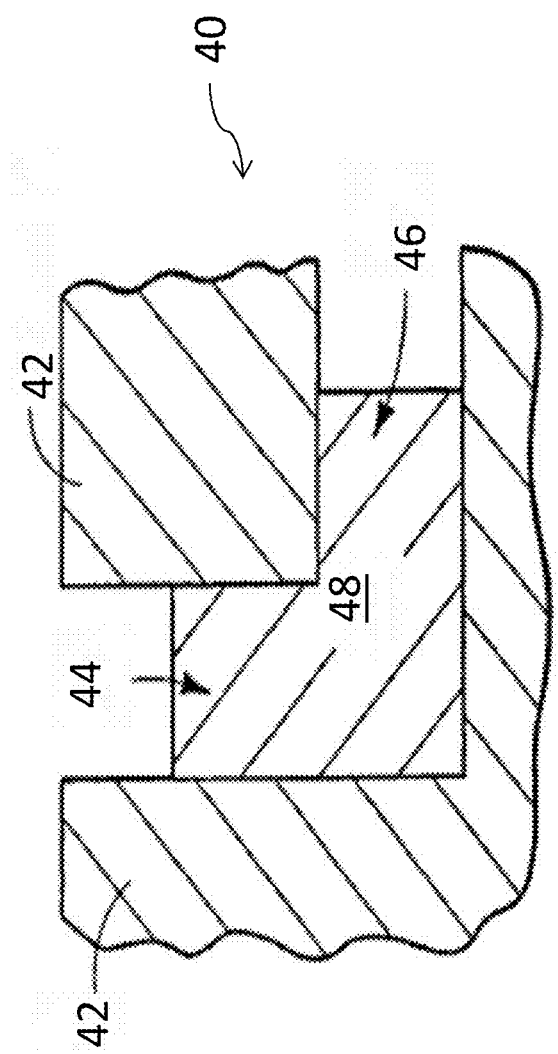
FIG. 2 a diagrammatic view of a portion of an equal channel angular extrusion (ECAE) apparatus.

ECAE is an extrusion technique, which consists of two channels of roughly equal cross-section meeting at a certain angle comprised practically between 90° and 140°, and typically 90°. FIG. 2 is a schematic of an example ECAE device 40. As shown in FIG. 2, an exemplary ECAE device 40 includes a mold assembly 42 that defines a pair of intersecting channels 44 and 46. The intersecting channels 44 and 46 are identical or at least substantially identical in cross-section, with the term "substantially identical" indicating the channels are identical within acceptable size tolerances of an ECAE apparatus. In operation, a material 48 is extruded through channels 44 and 46. Such extrusion results in plastic deformation of the material 48 by simple shear, layer after layer, in a thin zone located at the crossing plane of the channels. In some embodiments, channels 44 and 46 intersect at an angle of about 90°. However, it is to be understood that an alternative tool angle can be used (not shown). A tool angle of about 90° is typically used to produce optimal deformation, i.e. true shear strain. That is, using a tool angle of 90°, true strain is 1.17.

Grain refinement is enabled with ECAE by controlling 3 main factors: (i) simple shear, (ii) intense deformation and (iii) taking advantage of the various strain paths that are possible using multi-pass ECAE. Because a typical process characteristic of ECAE is high deformation per pass, multiple passes of ECAE (multi-pass ECAE) can be used in combination to reach extreme levels of deformation without changing the shape and volume of the billet after each pass. Rotating or flipping the billet between each pass allows various strain paths to be achieved. This allows control over the formation of the crystallographic texture of the alloy grains and the shape of various structural features such as grains, particles, phases, cast defects or precipitates.

As disclosed herein, ECAE may be used to impart severe plastic deformation into metals and alloys and give additional strength to those materials. There are two main mechanisms for strengthening during ECAE. The first is refinement of structural units, such as the material cells, sub-grains and grains at the submicron levels. This is also referred as grain size or Hall Petch strengthening and can be quantified using Equation 1.

$$\sigma_y = \sigma_o + \frac{k_y}{\sqrt{d}}$$ Equation 1

Where $\sigma_y$ is the yield stress, $\sigma_o$ is a material constant for the starting stress for dislocation movement (or the resistance of the lattice to dislocation motion), $k_y$ is the strengthening coefficient (a constant that is specific to each material), and d is the average grain diameter.

As disclosed by Equation 1, Hall Petch strengthening becomes particularly effective when d<1 micron. This effect is because sub-micrometer and nanometer sized grains (with d<1 micron) have a much higher number of grain boundaries compared to grains formed of transition materials (with d typically closer to 10-100 microns); these grain boundaries effectively block and retard the movement of dislocations. An additional strengthening mechanism introduced with ECAE is dislocation hardening. Due to high strains being introduced into the material by ECAE, a high number of dislocations are created and multiply to form complex networks of dislocations within the cells, the particles, subgrains, or the grains, including submicron grains.

In general, for some conventional Al alloys (e.g. the Al 1xxx to Al 8xxx series), certain benefits gained from ECAE are realized only for temperatures less than 250° C. In other words, in these Al alloys, the submicron grain size attained through ECAE is not stable after the Al alloy is subjected to temperatures above 250° C. for a few hours. This is because at temperatures greater than 250° C. the grain sizes grow discontinuously and the grains recrystallize into grains having diameters above 1 which provide only minor increases in strength. However, it has been found that the ECAE submicron grain size becomes more thermally stable up to temperatures of at least 300° C. when particular dispersoid elements or materials are added to the Al alloy before the ECAE treatment. In some embodiments, Al alloys have been created that have stable yield strength, hardness, and/or grain structures at temperatures as high as 425° C. These results have been achieved when using dispersoid elements such as Sc alone or in combination with Zr, Ti, Nb, Ni, Y, Li, Hf, V, Fe, Mn, Cr, Ta, La, Ce, Pr, Nd, Pm, Sm, Eu, Gd, Tb, Dy, Ho, Er, Tm, Yb, and Lu. Thus, it has been found possible to form Al alloys that have heightened yield strengths and hardness than previously achieved and maintained at 300° C., by combining dispersoids, grain size control, and dislocation hardening using ECAE.

One mechanism for this increase in yield strength and hardness is the nucleation and slow growth of nano-sized $Al_3(X_1,$ and/or $X_2)$ dispersoids at temperatures around 250° C.-275° C. $X_1$, $X_2$, etc. refers to the elements that form the dispersoid with Al, for example Sc or Zr. The dispersoids are distributed homogeneously throughout the interior of the submicron grains and along the grain boundaries. As a consequence, the dispersoids pin down the grain boundaries and effectively retard the growth of submicron grains and their subsequent recrystallization into larger grains as the Al alloy is heated. Similarly, dislocations may be pinned down by dispersoids, resulting in the movement of the dislocation stopped or retarded at high temperatures. It has been observed that the temperature and time for an optimum heat treatment (i.e. peak aging) falls close to 300° C. for a few hours and results in submicron grains surrounded by fine (less than about 100 nm in diameter) and homogeneous dispersoids, which give optimum mechanical properties.

It has also been found that applying ECAE to Al alloys containing dispersoids affects not only the grain refinement but also the precipitation of dispersoids in at least two other ways. First, ECAE results in faster nucleation of dispersoids during annealing (e.g. aging) after ECAE. This is due to the increased volume of grain boundaries and higher mechanical energy stored in sub-micron ECAE materials. Because of this increase, diffusion processes associated with dispersoid nucleation and growth are enhanced, which reduce the time necessary to reach peak aging for dispersoids, including even the most stable ones. One advantage of this effect is that ECAE reduces the time and energy required for employing heat treating operations, and in turn may reduce production costs. Second ECAE provides a more uniform and finer precipitation. That is, it leads to a more uniform distribution of very fine dispersoids (e.g. less than 1 µm, and usually less than 100 nm at peak aging). This uniform distribution of very fine dispersoids can be achieved in ECAE submicron structures because the high number of angle boundaries facilitates the nucleation process. The dispersoids are thus evenly distributed through the grain interior and grain boundaries which makes them available to decorate and pin dislocations in the Al alloy. Thus, a finer and more uniform precipitation of dispersoids is beneficial for strengthening.

Heightened Strengths Using Non-Dispersoid Forming Elements

Adding dispersoid-forming elements or materials well above the solubility limit of the dispersoid-forming element or material may be unsuitable, due to the limited availability of certain elements used to form dispersoids, in particular Sc and the rare earth elements such as La, Ce, Pr, Nd, Pm, Sm, Eu, Gd, Tb, Dy, Ho, Er, Tm, Yb, and Lu.

It has been found that a final strength of an Al alloy can be raised by adding elements including Zn, Mg, Mn, Si, Cu, Ni, B, Co, Fe, Cr, Li and V. This addition has been found to increase the final strength by about 5% to 20%. It should be noted that, in some cases, certain of these elements can form $Al_3X$ dispersoids, but may also react to form secondary phases other than $Al_3X$ dispersoids. These elements can be dissolved in solution or form either insoluble phases or soluble secondary phases.

One mechanism by which certain elements such as Zn, Mg, Mn, Si, Cu, Ni, B, Co, Fe, Cr, Li and V may be used in Al alloys to increase the overall strength is by solid solution strengthening. Alloying elements that remain dissolved in solid Al alloys strengthen the lattice structure and retard the movement of dislocations and contribute to the overall strength. If the amount added is within the limit of the solid element's solubility, secondary phases do not form and the hardening is due only to the elements present as individual atoms in solution in the matrix (i.e. solid solution strengthening). Often these compositions appear similar to that of pure Al. If the starting Al alloy has secondary phases made of, for example Si, Cu, Mn, Mg, Zn, Fe, Ni, Li, or Cr, and the Al alloy is then heated to the temperature range from about 300° C. to 350° C., some of the elements that were originally in the secondary phase, may leave the secondary phases and dissolve back into the Al matrix, resulting in solid solution strengthening.

As an additional example, certain elements such as Zn, Mg, Mn, Si, Cu, Fe, Cr, V, Ni, or Li may be used to form commercial Al alloys, and may form either soluble secondary phases or insoluble phases within the Al alloy. The soluble secondary phases (also called precipitates) are ones that can be heat treated by solutionizing, quenching and peak aging, to increase strength by a mechanism called "precipitation hardening." In precipitation hardening, soluble secondary phases block and retard the movement of dislocations. However those soluble phases reach their optimum size and correspondingly may contribute to peak strength only at lower temperatures, typically between 80° C. to 225° C. At around 300° C., these elements will form particles of secondary phases that have grown and coalesced to form particles well over 1.0 micron in size. If this occurs, most of the alloy's peak strength is lost. However the coarser soluble phases do still contribute marginally to the overall strength. In some instances, at 300° C. or higher temperatures, the soluble large secondary phase material may partially dissolve back into solution and contribute to the strength of the metal matrix by solid solution hardening, as previously described. In contrast, to soluble secondary phases, insoluble phases are formed during melting and are not controllable by subsequent heat treatment such as solutionizing, quenching and aging; these phases are usually large in size (well above 1 micron). These insoluble phases may contribute to strengthening if there is a suitably large enough amount of them to provide obstacles to dislocation movement. In some embodiments, it is therefore important to use a sufficiently high amount of these secondary phase forming elements. For example, above 0.5 wt. % in total may be suitable in order to have a sufficient contribution to the overall strength.

Having insoluble phases with certain elements in Al alloys, such as Zn, Mg, Mn, Si, Cu, Fe, Cr, V, Li, Ni, is similar to the situation that arises for dispersoid-forming elements when present in an amount far in excess of the maximum solubility limit of the given element as explained earlier. The material of the excess element form stable primary phases which can contribute somewhat to the overall strength, especially if there is a large number of primary phase particles. Note that some of those phases can be different than the $Al_3X$ phases, and are generally coarser and have a greater disparity with the lattice of the Al metal matrix, both factors that contribute to a less efficient strengthening effect.

As previously described, precipitation hardening is a processing technique that uses the fact that some of the more common Al alloying elements, such as Zn, Mg, Mn, Si, Cu, Fe, Cr, V, Ni, and Li contribute to strengthening by creating soluble secondary phases with optimal sizes and distributions to block or retard the movement of dislocations. A three step procedure can be used to increase strength in Al alloys containing these elements, and is as follows.

Solution Annealing (Solutionizing) at High Temperatures:

Alloying elements with a higher solubility at high temperature may be dissolved into the metal matrix and joined into the solid solution. If these elements are precipitates, the precipitates will also diffuse and dissolve into the matrix.

Quenching:

After solution annealing, the material is rapidly cooled in water or oil to maintain a maximum quantity of soluble elements in the matrix. In that case, those elements are unstable and in non-equilibrium because there are above their solubility limit at room temperature.

Aging or Age Hardening (at Lower Temperature than Solution Annealing):

Unstable alloying elements are removed from solution by heat treatment (precipitation or "aging") at a lower temperature. Physically the alloying elements precipitate out of solid solution to form discrete particles. Peak aging corresponds by definition to the optimal conditions of temperature and time to get the best particle size and distribution for optimum strength. This practice produces precipitates throughout the metal that strengthens the matrix without spoiling the conductivity. For heat treatable Al alloys (i.e. the 2000, 6000, or 7000 series, or Al—Li) that include elements such as Zn, Mg, Mn, Si, Cu, Fe, Cr, V, Ni, Li, the temperature region for optimum precipitation hardening is from about 85° C. to 200° C. Annealing for a few hours in this temperature range provides a suitable strength due to the resulting size and distribution of precipitates. However, above 200° C. to 225° C., and possibly at 300° C., the strength due to precipitation hardening is lost; strength loss may be more than 50% at 300° C. The main cause of the loss is the growth and eventual dissolution of precipitates at temperatures higher than about 200° C.

Sample Compositions

In some embodiments, an Al alloy can be formed containing Sc from about 0.05 wt. % to about 20.0 wt %, from about 0.05 wt. % to about 10.0 wt. %, from about 0.05 wt. % to about 1.0 wt. %, or from about 0.05 wt. % to about 0.5 wt. % or from about 0.1 wt. % to about 0.5 wt. %.

In some embodiments, an Al alloy can be formed containing dispersoid-forming elements other than Sc, for example Zr, Ti, Nb, Ni, Y, Li, Hf, V, Fe, Mn, Cr, Ta, or rare earth elements including La, Ce, Pr, Nd, Pm, Sm, Eu, Gd, Tb, Dy, Ho, Er, Tm, Yb, and Lu. In some embodiments, additional dispersoid-forming element or elements may be added to an Al alloy that contains Sc. In some embodiments, certain dispersoid-forming element or elements may be added to an Al alloy instead of Sc. In some embodiments the dispersoid-forming element or elements may be added to an Al alloy in an amount that forms a combined weight percentage of the dispersoid-forming material alone or in combination with the Sc in the Al alloy from about 0.05 wt. % to about 20.0 wt. %, from about 0.05 wt. % to about 10.0 wt. %, from about 0.05 wt. % to about 1.0 wt. %, or from about 0.05 wt. % to about 0.5 wt. % or from about 0.1 wt. % to about 0.5 wt. %.

In some embodiments an Al alloy can be formed having Sc and additional strengthening elements such as Mg, Mn, Si, Cu, Ni, Mo, Cr, Zn, Li, V, Fe, B, Zr, Li, Bi, Pb. In some embodiments an Al alloy can be formed having Sc, an additional dispersoid-forming element or elements, and additional strengthening elements. In some embodiments, one additional strengthening element may be added. In some embodiments, two or more additional strengthening elements may be added. In some embodiments, the total amount of additional strengthening elements makes up greater than 0.1 wt. %, greater than 0.3 wt. %, greater than 0.5 wt. %, or greater than 1.0 wt. % of the Al alloy.

In some embodiments an Al alloy can be formed having less conventional additions for Al alloys, such as tungsten (W), carbon (C), oxygen (O), molybdenum (Mo), cobalt (Co), silver (Ag), silicon carbide (SiC), and other forms of nanoparticles such as nanotubes, cermets, oxides, carbides, silicides, and fullerenes. In some embodiments an Al alloy can be formed having Sc and less conventional additions for Al alloys, such as W, C, O, Mo, Co, Ag, SiC, and other forms of nanoparticles such as nanotubes, cermets, oxides, carbides, silicides, and fullerenes. In some embodiments an Al alloy can be formed having Sc, an additional dispersoid-forming element or elements, and less conventional additions for Al alloys, such as W, C, O, Mo, Co, Ag, and dispersoid forming materials such as nanotubes, cermets, oxides, carbides such as SiC, silicides, and fullerenes.

In some embodiments, Sc is added to an Al alloy to form $Al_3(Sc)$ dispersoids and the Al alloy has an average grain size less than 1 micron in diameter, or less than 100 nm in diameter (i.e. coherent $Ll_2$ coherent precipitates, usually cubic phases). In some embodiments, Sc is added to an Al alloy with one or more dispersoid-forming elements that combine with Sc to form stable dispersoids in the form of $Al_3(Sc, X_i)$ where "$X_i$" denotes a dispersoid-forming element other than Sc. Generally Sc may be added to an Al alloy with one or more dispersoid-forming elements that combine with Sc to form stable dispersoids in the form of $Al_n(Sc, Xi)_m$ where the ratio of "n" to "m" is ≥3. In some embodiments, Sc is added to an Al alloy with one or more dispersoid-forming elements that combine with Sc to form stable dispersoids in the form of $Al_3(Sc, X_i)$ with an average grain size of less than 1.0 micron at temperatures of at least 300° C.

In some embodiments, the Al alloy maintains a stable grain size and grain size distribution at temperatures greater than 300° C. In some embodiments, the grain sizes remains stable at temperatures greater than 300° C. for greater than one hour, greater than two hours, or greater than three hours.

In some embodiments, using the materials and methods disclosed herein, an Al alloy can be created that maintains yield strength of at least 40 ksi and which is stable at temperatures at least as high as 300° C. for at least 30 minutes, for at least 1 hour, or for at least 2 hours. In some embodiments, using the material and methods disclosed herein an Al alloy maintains a Brinell hardness of greater than 92 HB and which is stable at temperatures at least as high as 300° C. for at least 30 minutes, for at least 1 hour, or for at least 2 hours. In some embodiments, using the material and methods disclosed herein an Al alloy maintains a grain size less than 1 micron and which is stable at temperatures at least as high as 300° C. for at least 30 minutes, for at least 1 hour, or for at least 2 hours.

Sample Method of Forming Aluminum Alloy Backing Plate

Figure 3:
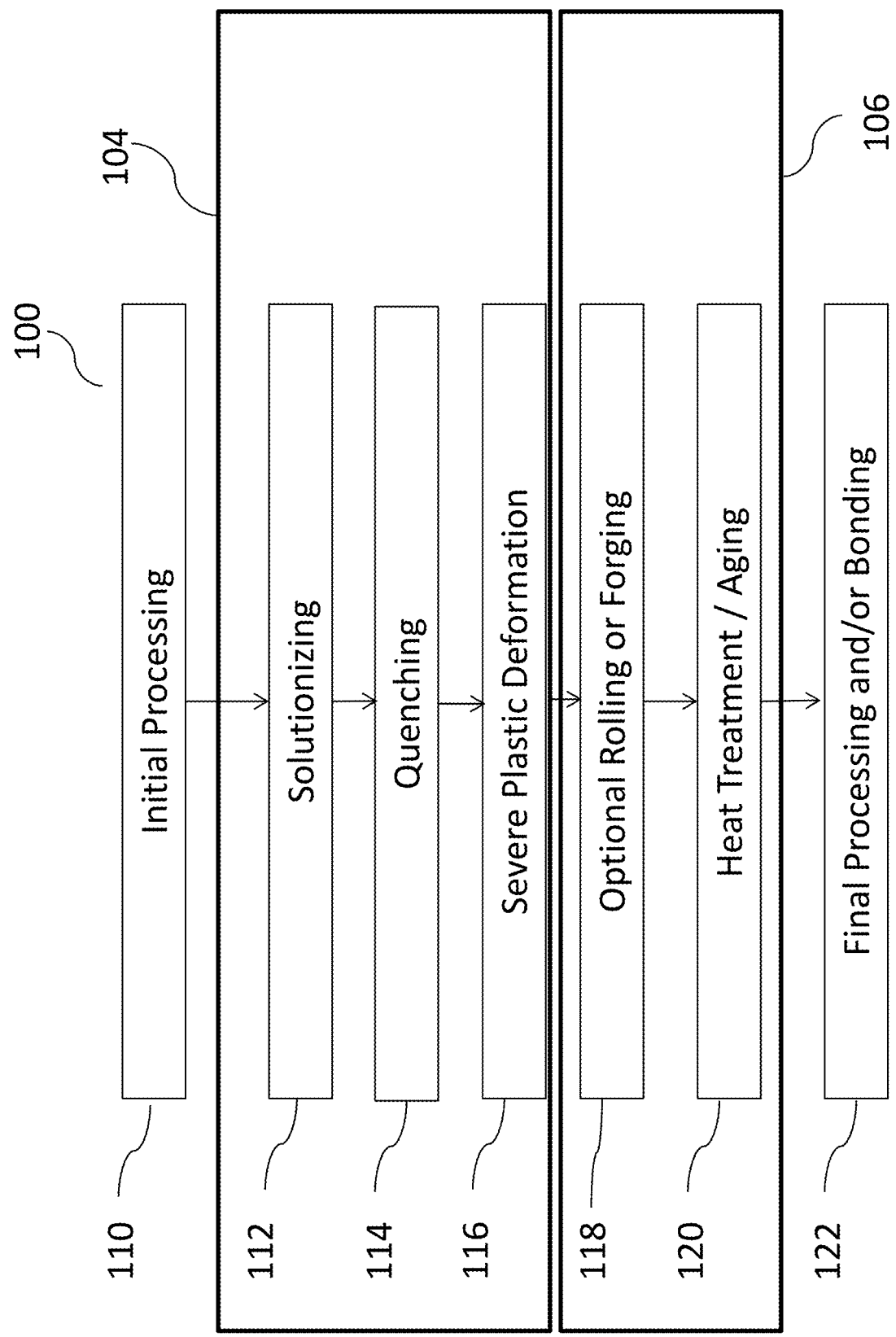
FIG. 3 is a flow diagram of a method of forming an Al alloy according to some embodiments.

FIG. 3 contains an overall flow diagram of a sample method 100 that includes some or all of the various techniques disclosed herein. As shown in FIG. 3, in some embodiments, the method 100 may include a base hardening step 104 and an optional additional hardening step 106. As shown in FIG. 3, overall the method 100 may employ the following steps: initial processing 110 such as casting followed by solutionizing 112, quenching 114, and severe plastic deformation 116 such as ECAE. Following the base hardening step 104 the additional hardening step 106 may be used in combination with the base hardening step 104. In some embodiments, the additional hardening step 106 includes rolling or forging 118 and a heat treatment step 120. The heat treatment step 120 may include age hardening or aging. In some embodiments, the base hardening step 104 and the additional hardening step 106 may be followed by preparation or bonding 122 of the material that has been formed using the method 100. In some embodiments, the heat treatment step 120 may be carried out at the same time as a bonding step 122. Further details of each step are described below.

Initial Processing (Casting)

As shown in FIG. 3, the method 100 may include initial processing 110 such as casting an Al material or Al alloy. Conventional casting may first be used to form an Al alloy with a given composition. During casting, an Al material or Al alloy may first be melted, and dispersoid-forming elements, such as one or more of Sc, Zr, Ti, Nb, Ni, Y, Hf, V, Fe, Li, Mn, Cr, Ta, La, Ce, Pr, Nd, Pm, Sm, Eu, Gd, Tb, Dy, Ho, Er, Tm, Yb, or Lu can be added directly to the melt either directly as a pure element or as part of a pre-cast master alloy. A suitable casting and mixing method is to use a master alloy. Suitable master alloys for Sc include Al having 2.0 wt. % Sc, Al having 10.0 wt. % Sc, or and Al having 20.0 wt. % Sc. Alternatively or additionally, Zr may be added, as a pre-cast master alloy of Al having 10.0 wt % Zr, for example. It is beneficial to have from 0.1 wt % to 0.5 wt. % of Sc in the final composition to form dispersoids that contribute form suitable stability and strength.

For alternative strengthening elements that form either standard soluble secondary phases or insoluble precipitates, it may be advantageous to use elements already present in standard commercial Al alloys including Mg, Mn, Si, Cu, Ni, Mo, Cr, Zn, Li, V, Fe, B, Zr, V, Bi, Pb. A suitable amount of these elements may be from about 0.5 wt. % to about 15.0 wt. %.

One technique for casting is to provide a commercial Al alloy either from a heat treatable series (Al2000, Al6000, Al7000, Al800) or non-heat treatable series (Al1000, Al3000, Al4000, Al5000), melt the Al alloy composition, then add to the melt the elements that form the dispersoids (i.e. Sc, Zr) either directly in the form of pure elements or by using pre-cast master alloys.

Solutionizing (Heat Treatment)

As shown in FIG. 3, the method 100 may include solutionizing 112 the cast Al alloy. The goal of solutionizing 112 is to dissolve the highest possible amount of a material that forms dispersoids or dispersoid-forming elements, such as Sc, Zr, Ti, Nb, Ni, Y, Hf, V, Fe, Mn, Cr, Ta, Ce, Pr, Nd, Pm, Sm, Eu, Gd, Tb, Dy, Ho, Er, Tm, Yb, or Lu into the solid Al alloy or Al material. High temperatures are used because alloying elements have a higher solubility at high temperatures.

In some embodiments, because of the high thermal stability and therefore slow dissolution dynamics of dispersoid-forming elements, solutionizing 112 is preferably conducted at temperatures just below (typically 10-30° C. below) the solidus temperature of a given composition and for long times, often as long as 1 hour, greater than 3 hours, at least 24 hours and potentially up to 100 hours. For example, Al5083 alloy has a solidus temperature of 570° C. Therefore, when Sc is added Al5083, a suitable temperature and time for solutionizing 112 is 540° C. to 560° C. for about 24 hours. For almost pure Al, the solidus is around 660° C. and typical solutionizing temperatures and times when adding Sc are between 630° C. and 650° C. for 24 to 72 hours. In general, most Al alloys have a solidus temperature between 560° C. and 660° C. so a suitable temperature range for solutionizing 112 Al alloys is around 530° C.-650° C. In some embodiments, lower temperatures (up to 60° C. below the solidus temperature) may be used for solutionizing 112 Al alloys, however, the use of a lower temperature may correspond to a longer solutionizing time to form a suitable alloy. In some embodiments, solutionizing 112 may be carried out at about 500° C. with a suitable solutionizing time of about 120 hours. In some embodiments, high temperature treatments can also be used to homogenize the distribution of elements.

Quenching

As shown in FIG. 3, the method 100 may include quenching 114 the cast Al alloy to form a billet. After solutionizing 112, the processed material is rapidly cooled in water or oil to maintain the highest weight percentage of soluble elements in the Al metal matrix. After quenching 114, the solutionized elements are supersaturated, e.g. in non-equilibrium, because they are present in a concentration above their solubility limit in Al at room temperature.

Severe Plastic Deformation (ECAE)

As shown in FIG. 3, the method 100 may include severe plastic deformation 116, such as ECAE of the cast Al alloy billet. In some embodiments, ECAE may include between 1 and 6 passes of the billet. In some embodiments, 3 to 6 passes provides a suitably refined submicron structure. It may also be desirable to rotate the billet by 90 degrees between each pass. In some embodiments, ECAE can be carried out at particular temperatures by heating the billet and the die. In some embodiments, it is suitable to carry out ECAE above or below the peak aging temperature for soluble secondary phases formed by elements in Al alloys, such as Mg, Mn, Si, Cu, Ni, Mo, Zn, Fe (i.e. less than 85° C. or above 200° C. for Al). In some embodiments, it is suitable to carry out ECAE below the aging temperature of certain dispersoid-forming elements such as Cr, Fe, Hf, Mg, Mn, Nb, Ni, Sc, Ti, V, Zr, Y, Li, Ta, Mo, La, Ce, Pr, Nd, Pm, Sm, Eu, Gd, Tb, Dy, Ho, Er, Tm, Yb, Lu) (e.g. 250° C. to 275° C. for Al).

In some embodiments, ECAE is carried out at temperatures below the peak aging temperature of a given material (temperatures less than 85° C. for Al) or warm (temperatures between 175° and 275° C.) conditions. ECAE is preferentially performed at temperatures below about 250° to 275° C. for two reasons. The first reason is dispersoids start to nucleate at around 250° C.-275° C. The second reason is that there may be substantial grain growth of the submicron structure during intermediate annealing of the billet or dynamic grain growth during ECAE at these temperatures. Moreover, when elements such as Mg, Mn, Si, Cu, Ni, Fe, Zn, are present in addition to dispersoid-forming elements, ECAE may be carried out at temperatures either below or above the peak aging temperature of a given soluble phase (e. g. at temperatures less than 85° C. or above 200° C. for Al). It has been found that when peak aged and hardened, precipitation strengthened alloys may have a limited capacity for cold working, i.e. plastic deformation. For an Al alloy containing certain elements such as Mg, Mn, Si, Cu, Ni, Fe, Zn, precipitation hardening typically occurs between 85° C. and 200° C. It is therefore suitable to process the Al alloy at a temperature above or below the peak aging temperature of a given second phase element such as Mn, Mg, Si, Zn, Cu, Fe. This typically corresponds to temperatures from 85° C. to about 200° C. At temperatures above the typical peak aging temperatures (i.e. above 200° C.), precipitates start to grow and the material starts to lose strength and gain ductility. It is therefore softer and easier to process by severe plastic deformation. At temperatures below 85° C., precipitation of most conventional elements used in Al alloys has not started and the material is therefore also soft and easier to process by severe plastic deformation.

In some embodiments, the Al alloy is solutionized and quenched prior to ECAE when the solutionizing and quenching parameters are optimized for dispersoids and not conventional elements that form secondary phases. Solutionized and quenched materials have no (or less) precipitates and therefore do not block or slow down the movement of dislocations and rotation of grain boundaries during severe plastic deformation. Thus in solutionized materials, a fewer number of ECAE passes may be suitable to adequately form an optimum sub-micron structure.

In some embodiments, an optimum number of ECAE passes was found to be beneficial for strengthening Al alloys with particular dispersoids. For example, an ECAE process using 4 passes has been found to produce better results than 1 pass. This is particularly suitable when processing is done at temperatures below 250° C. or 275° C., which is below the temperature at which dispersoids start to nucleate and grow. Under these processing conditions, using 4 ECAE passes provides a better submicron structure with a higher number of high angle boundaries that contribute to improve the thermal stability of the submicron structure than using 1 ECAE pass. As a result, a higher and more stable overall strength level is achieved. This is described further below in the Examples.

Optional Rolling or Forging

As shown in FIG. 3, the method 100 may include additional processing such as optional rolling or forging 118. In some embodiments, additional processing using standard plastic deformation may be used to further increase the final strength or hardness of certain Al alloys. Additionally, standard rolling and forging steps can be used after ECAE to get closer to the final billet shape before machining into the ultimate product shape. In some embodiments, rolling or forging is applied after the solutionizing, quenching, or ECAE and preferentially before annealing or temperature aging. These steps may increase the final hardness by introducing more dislocations in the ECAE refined structures. Such dislocations can be pinned down by precipitates during further annealing.

Heat Treatment (Aging)

As shown in FIG. 3, the method 100 may include heat treatment 120 which may include peak aging. In some embodiments, the Al alloy billet may be subjected to a peak aging or annealing step. In some embodiments, peak aging may be conducted by subjecting the Al alloy to temperatures between 275° C. and 350° C. for at least 30 minutes, greater than one hour, or greater than two hours. Longer peak aging treatment times, for example as long as 24 hours may be suitable for certain Al alloys. In some embodiments, peak aging may be carried out in conjunction with another treatment step. For example, peak aging may be carried out simultaneously with bonding the Al alloy to another metal body using a treatment such as hot isotactic pressing (HIPing), described further below.

During the heat treatment of peak aging, alloying elements such as Sc, Zr, Ti, Li Nb, Ni, Y, Hf, V, Fe, Mn, Cr, Ta, La, Ce, Pr, Nd, Pm, Sm, Eu, Gd, Tb, Dy, Ho, Er, Tm, Yb, and Lu may migrate from the matrix solution and form very fine dispersoids, often having a size less than one micron in diameter. Physically the alloying elements precipitate out of the solid solution to form discrete particles in a new phase. In general, peak aging parameters should correspond to the optimal temperature and time to attain the best particle size and distribution for optimum strength. This treatment step may be used to produce fine precipitates throughout the Al alloy, which strengthens the matrix without detrimentally altering the conductivity.

Final Processing and/or Bonding

As shown in FIG. 3, the method 100 may include final processing which may include bonding 122. In some embodiments, the final processing may include forming the Al alloy into a backing plate for use in a sputtering process. In some embodiments, a backing plate may be joined to a sputtering target using a bonding process. A commonly used bonding process is hot isotactic pressing (HIPing). HIPing involves heating the material or materials to be joined to a suitable temperature and applying pressure to the material or materials. HIPing may lead to the material or materials bonding together, and voids within the material or materials can be reduced or eliminated and powders can be consolidated to create a more dense material. Common HIPing parameters for bonding an Al backing plate to a sputtering target may be about 300° C. for two hours. Other bonding methods include epoxy bonding, soldering, brazing, explosive bonding, mechanical joining (using keys, bolts, etc.) or welding.

Relationship Between Hardness and Yield Strength

In the examples described in next section, Brinell hardness was used as an initial test to evaluate the mechanical properties of Al alloys at high temperatures. Measuring Brinell hardness is a relatively straightforward testing method and is faster than tensile testing. It can be used to form an initial evaluation for identifying suitable materials that can then be separated for further testing.

Tensile strength is usually characterized by 2 parameters: yield strength (YS) and ultimate tensile strength (UTS). Ultimate tensile strength is the maximum measured strength during a tensile test and it occurs at a well-defined point. Yield strength is the amount of stress at which plastic deformation becomes noticeable and significant under tensile testing. Because there is no definite point on an engineering stress-strain curve where elastic strain ends and plastic strain begins, the yield strength is chosen to be that strength when a definite amount of plastic strain has occurred. For general engineering structural design, the yield strength is chosen when 0.2% plastic strain has taken place. The 0.2% yield strength or the 0.2% offset yield strength is calculated at 0.2% offset from the original cross-sectional area of the sample (s=P/A). Yield strength is much more sensitive than ultimate tensile strength to factors such as grain size and variations in phase size and distribution.

The hardness of a material is its resistance to surface indentation under standard test conditions. It is a measure of the material's resistance to localized plastic deformation. Pressing a hardness indentor into the material involves plastic deformation (movement) of the material at the location where the indentor is impressed. The plastic deformation of the material is a result of the amount of force on the indentor exceeding the strength of the material being tested. Therefore, the less the material is plastically deformed under the hardness test indentor, the higher the strength of the material. At the same time, less plastic deformation results in a shallower hardness impression; so the resultant hardness number is higher. This provides an overall relationship, where the higher a material's hardness, the higher the expected strength.

Figure 4:
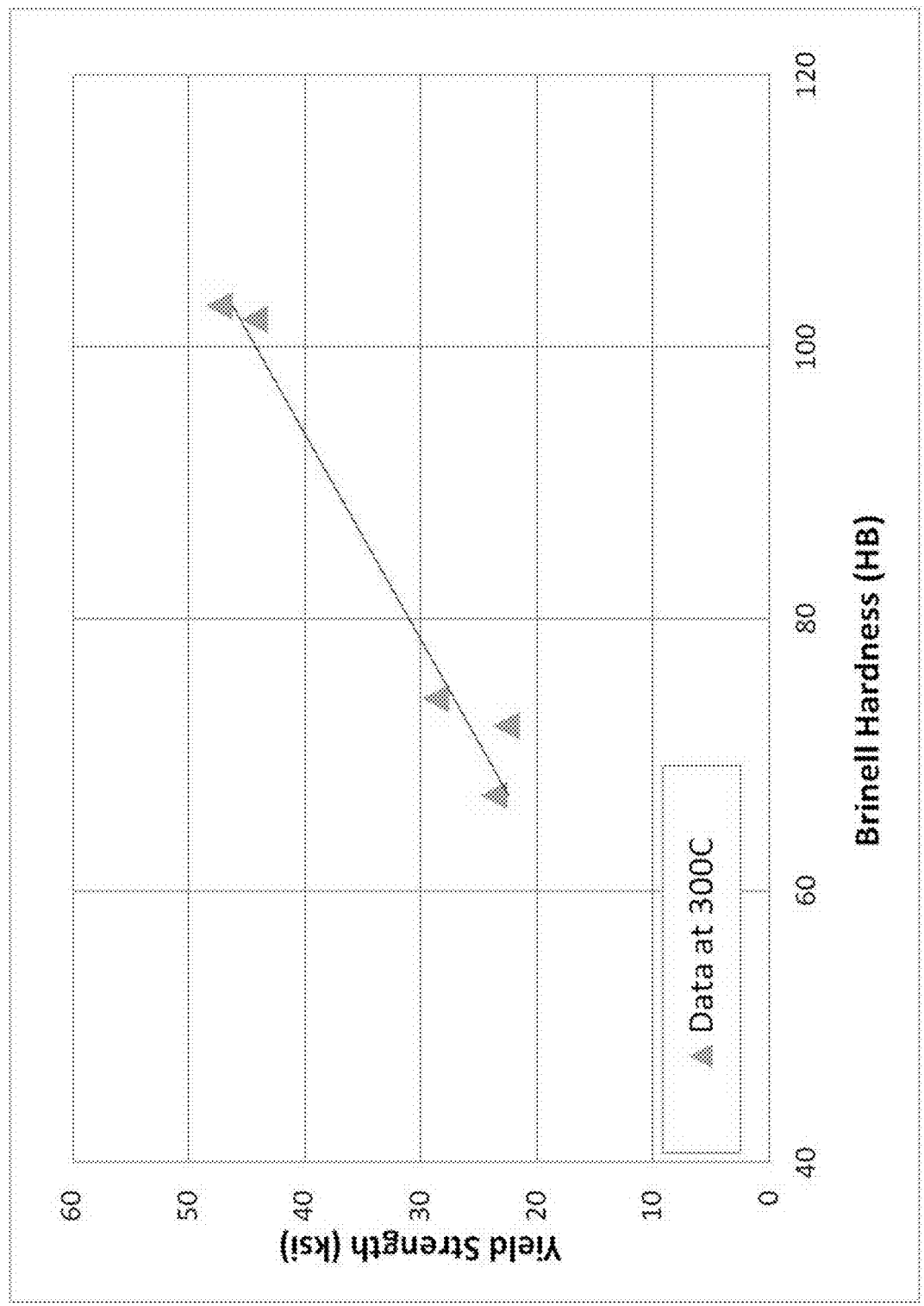
FIG. 4 is a comparison of Brinnell hardness to yield strength for an example aluminum material.

That is, both hardness and yield strength are indicators of a metal's resistance to plastic deformation. Consequently, they are roughly proportional. FIG. 4 shows the relationship between Brinell hardness and yield strength for an Al alloy. Typically, yield strength of about 40 ksi is suitable for an Al alloy that is to be used to form a backing plate. Thus as shown in FIG. 4, a corresponding Brinnell hardness to 40 ksi is about 92 HB. Note however that the relationship is more precise empirically for ultimate tensile strength rather than yield strength because yield strength is more sensitive to other microstructural factors such as grain and phase size and distribution. It is therefore important to understand and empirically measure the relationship between yield strength and hardness for each material. Such a relationship was evaluated for the materials and examples given below.

EXAMPLES

The following non-limiting examples illustrate various features and characteristics of the present invention, which is not to be construed as limited thereto. Unless otherwise noted, all amounts are weight percentages.

The methods of the instant application may be used to form Al alloys with higher yield strength and/or hardness than previously available, particularly Al alloys that maintain yield strength and/or hardness even after being heated to temperatures of about 300° C. for extended periods of time. In some embodiments, the Al alloy is suitable for forming a backing plate for use in a sputtering target assembly. The desired Al alloy is one that can be subjected to HIPing temperatures around 300° C. without compromising yield strength to less than about 40 ksi. As disclosed above with reference to FIG. 4, in an initial assay, it was determined that for Al alloy, a Brinell hardness above 92 HB corresponds to a yield strength above 40 ksi. Thus, a Brinell hardness of 92 HB was used as an initial point of reference.

As an initial comparison, the yield strengths of commonly available Al alloys that are suitable for forming a backing plate are shown in Table 1, after the measured Al alloy underwent ECAE processing. As shown in Table 1 below, the maximum temperature that commonly available Al alloys maintain thermal stability to is about 200-225° C. It is noted that this temperature range it is less than the desired the hipping temperature of 300° C. for backing plate assemblies.

TABLE 1

Yield Strength of Common Al Alloys

| Type of Alloy | Material (Al alloy) | Processing Condition | Yield Strength (ksi) | Maximum Thermal Stability Range | Processability |
|---|---|---|---|---|---|
| Non heat treatable Al alloys | Al5052 | ECAE | 40-50 | up to 200° C. | Good |
|  | Al5083 | ECAE | 60-65 | up to 200° C. | Good |
|  | Al3004 | ECAE | 50-55 | up to 225° C. | Good |
| Heat treatable Al alloy | Al6061 | ECAE | 50-60 | up to 200° C. | Good |
|  | Al2219 | ECAE | 60-65 | up to 200° C. | Good |
|  | Al2618 | ECAE | 75-82 | up to 225° C.-250° C. | Good |
|  | Al7075 | ECAE | 70-80 | up to 150° C. | Good |

Figure 5:
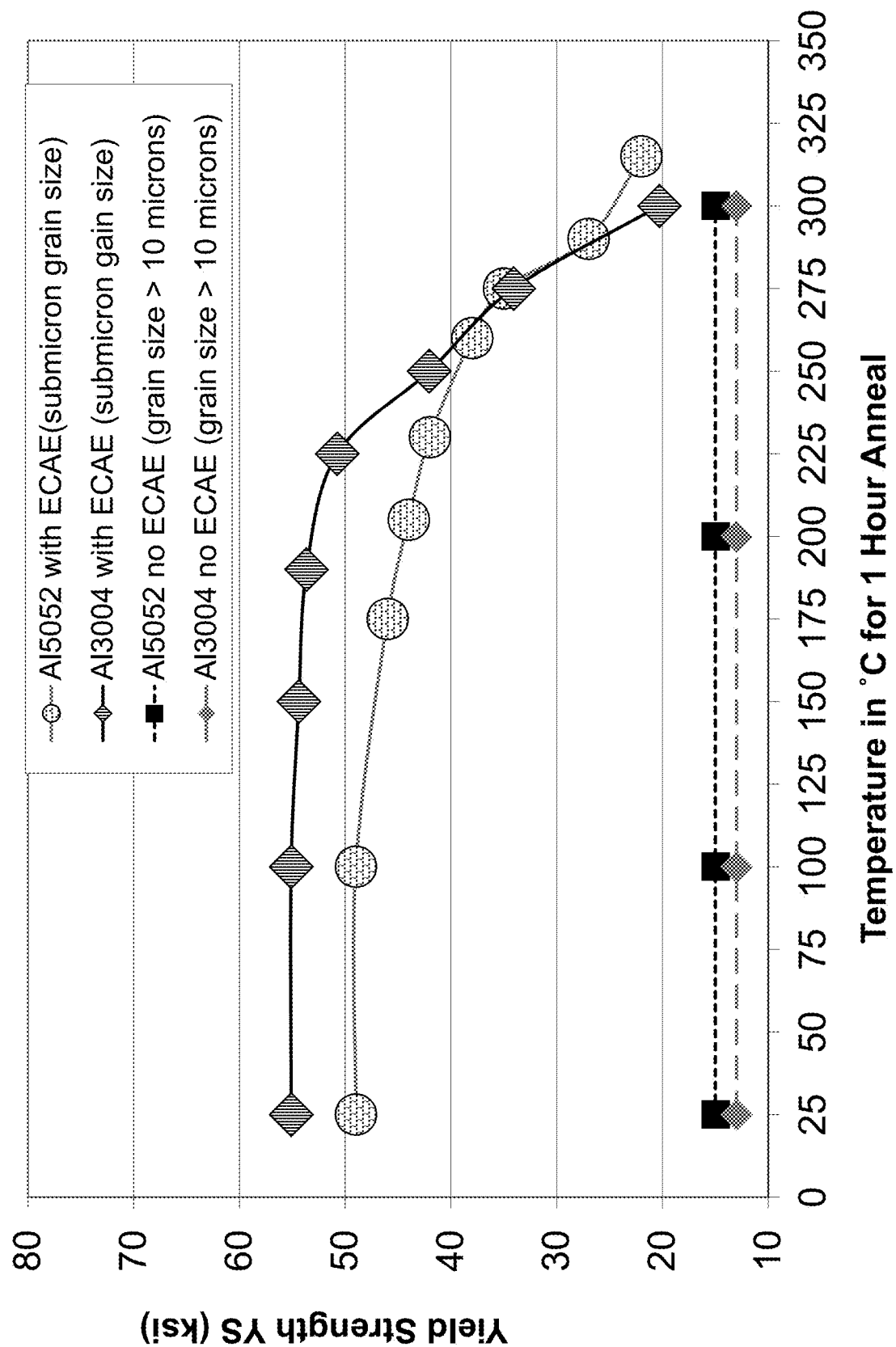
FIG. 5 is a graph comparing temperature to yield strength of certain aluminum alloys.

FIG. 5 shows the yield strength for two non-heat treatable Al alloys, Al3004 and Al5052, as a function of temperature after annealing for 1 hour, both with and without processing with ECAE. Note that the yield strength for each of the two alloys increased by over 5 times after each alloy was subjected to ECAE. However, the yield strength of both alloys was well below 40 ksi (around 20 to 23 ksi respectively) after being at a temperature of 300° C. for at least 1 hour.

Figure 6:
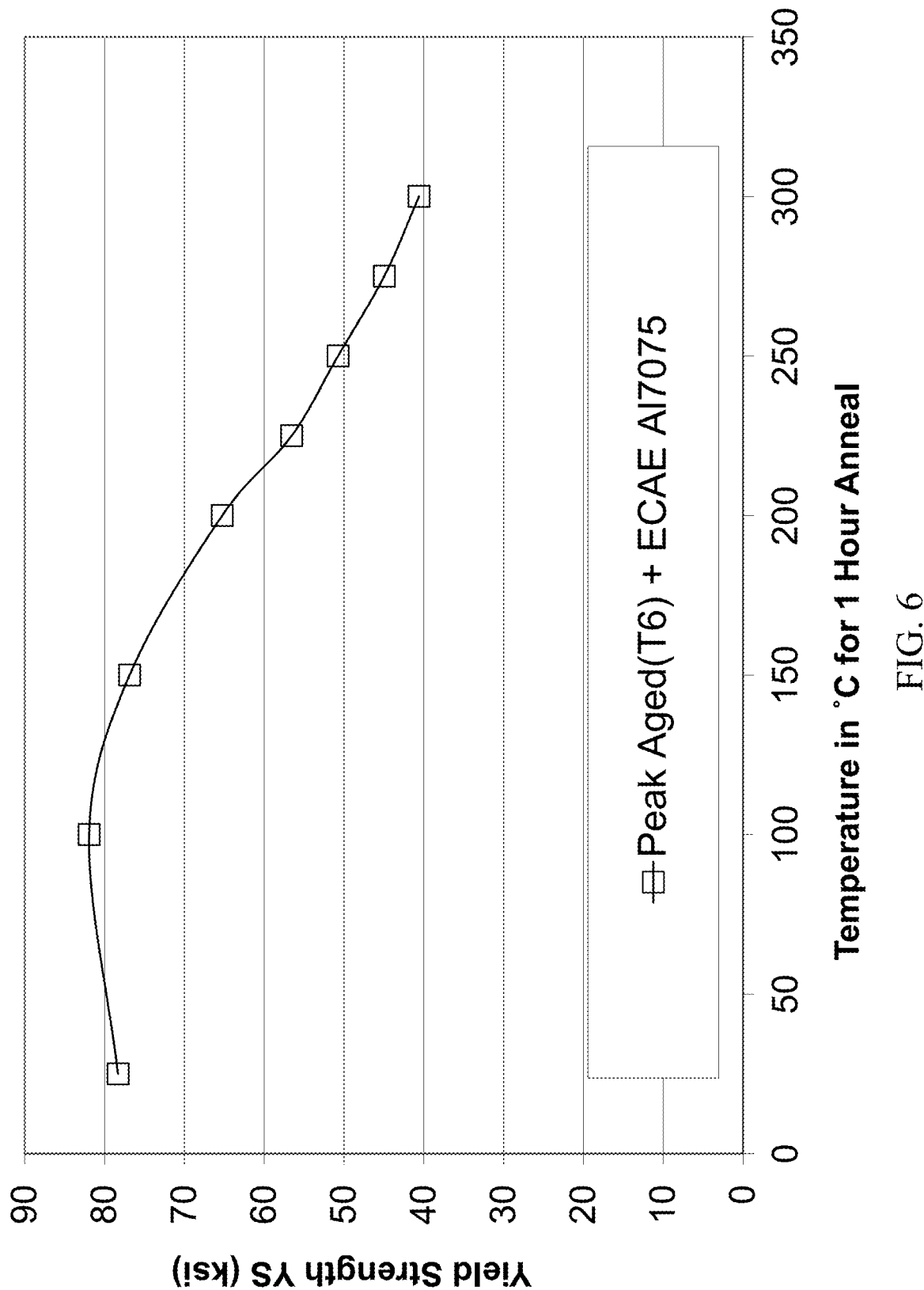
FIG. 6 is a graph comparing temperature to yield strength of an example aluminum alloy.

FIG. 6 shows the yield strength for heat treatable Al alloy Al7075 as a function of temperature after annealing for 1 hour after being subjected to ECAE. Note that the yield strength dropped to about 40 ksi after being at a temperature of 300° C. for at least one hour.

Figure 7:
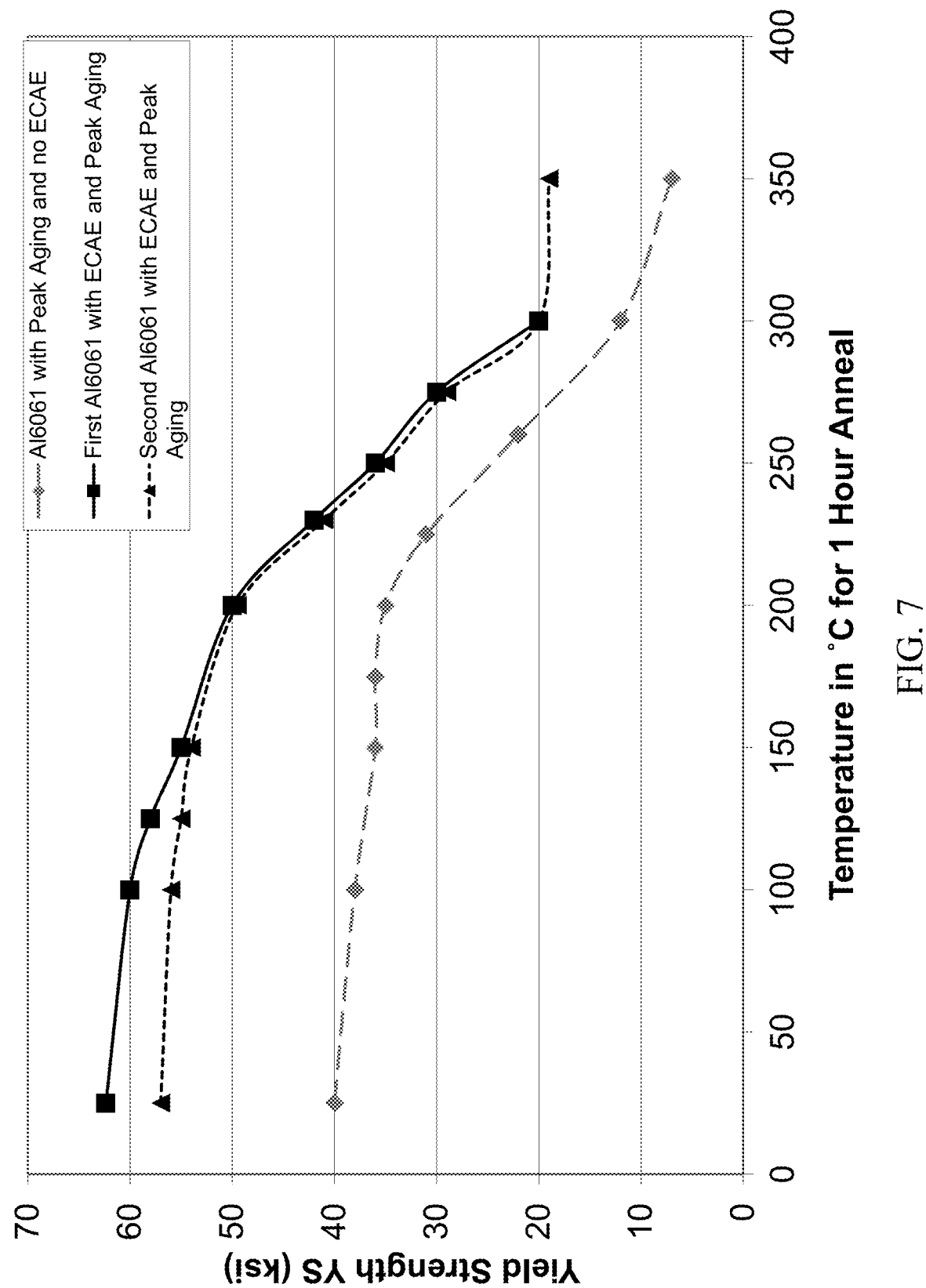
FIG. 7 is a graph comparing temperature to yield strength of certain aluminum alloys.

FIG. 7 shows the yield strength for heat treatable Al alloy Al6061 as a function of temperature after annealing for 1 hour for two samples that were subjected to ECAE and underwent peak aging and one sample that underwent no ECAE and no peak aging. Note that the yield strength dropped to about 20 ksi after each sample of the alloy was at a temperature of 300° C. for at least one hour.

Figure 8:
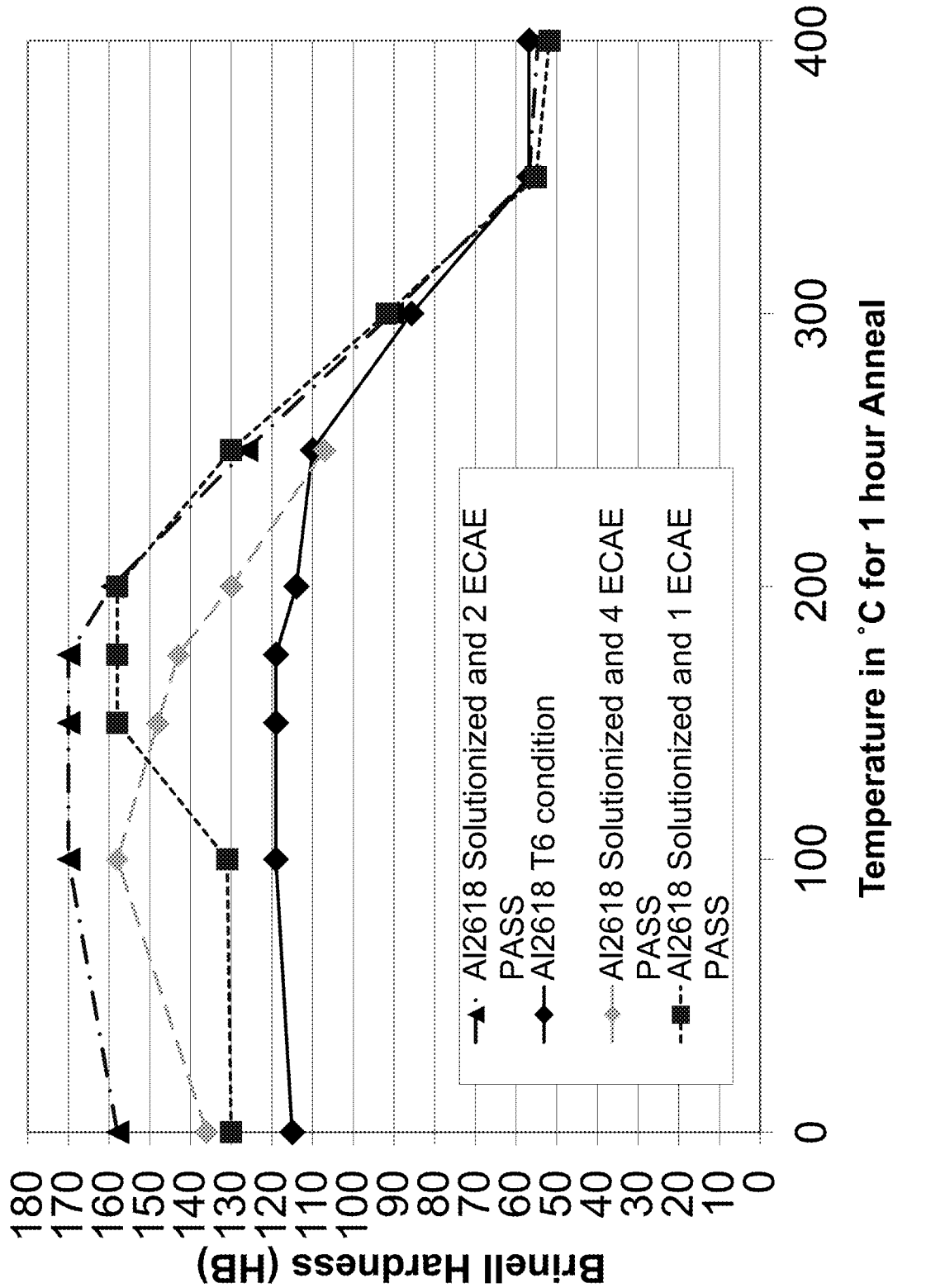
FIG. 8 is a graph comparing the hardness of certain aluminum materials at various temperatures.

FIG. 8 illustrates the Brinell hardness for heat treatable Al alloy Al2618 as a function of annealing temperature for 1 hour for four representative treatment methods. In all cases, after annealing at 300° C. for at least one hour, the Brinell hardness is below 92, which would correspond to the yield strength of at least 40 ksi. Note that this alloy, Al2618, is the most thermally stable Al alloy that was tested.

Example 1: Effect of Doping 99.999% (5N) Al with Various Elements on Thermal Stability after ECAE In this example, the effect of doping high purity 99.999% (5N) Al with specific elements was evaluated to find a suitable dopant that would provide suitable thermal stability to an Al alloy. The doping elements that were studied were Si, Cu, Sc, Ti, Mo, Hf, Zr and Mn. Experiments were conducted to compare the effect of each element on the thermal stability of the Al submicron grain size attained after subjecting the doped Al alloy to ECAE. In this example, four ECAE passes with 90 degree rotation of the Al billet between each pass was performed for all the samples after casting, solutionizing and quenching. The results are compared in FIG. 9.

Figure 9:
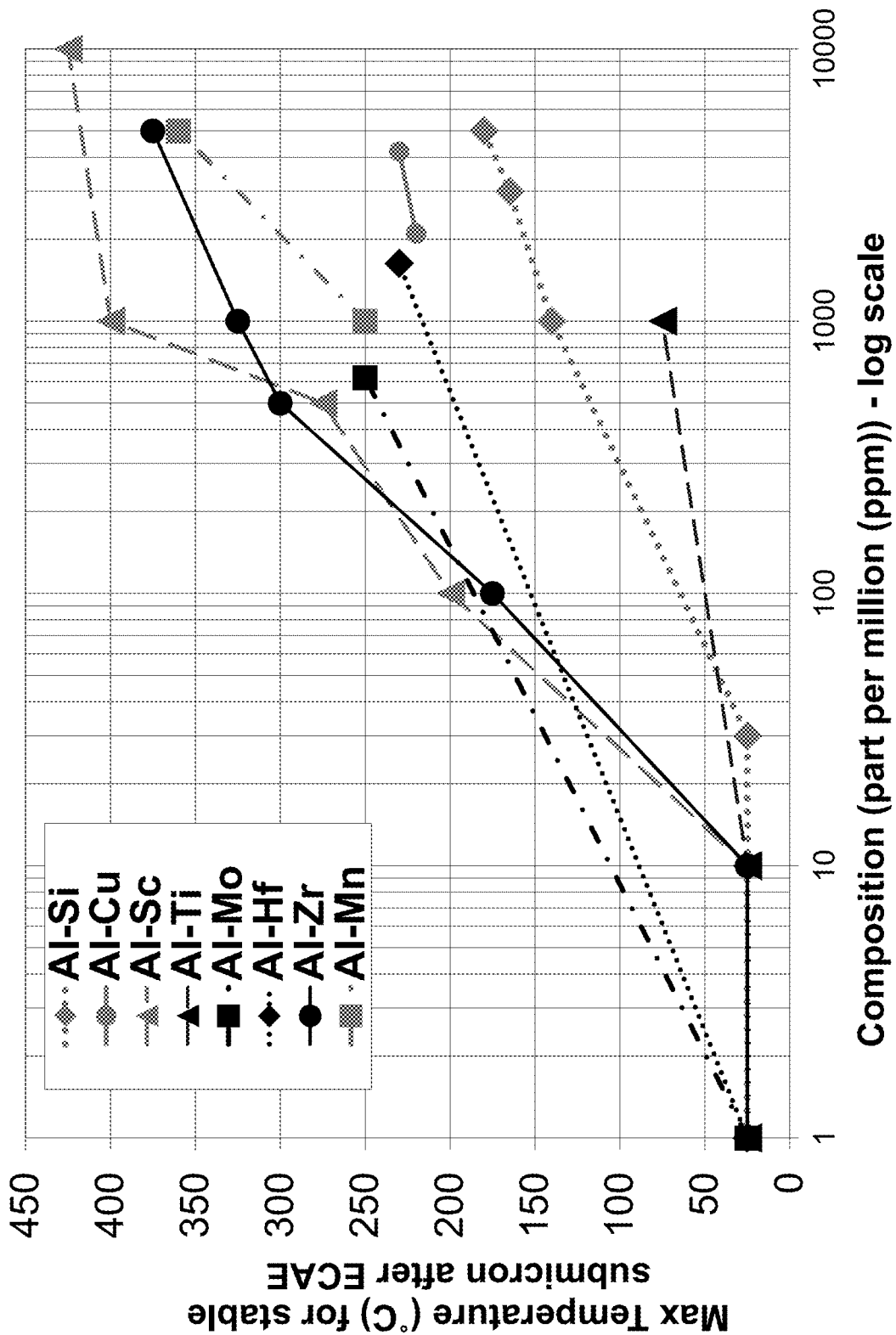
FIG. 9 is a graph comparing the composition of certain aluminum materials to thermal stability.

In FIG. 9, the y axis represents the maximum temperature that each sample was subjected to for 1 hour before the average grain size of the material exceeded 1 micron in diameter. The x-axis gives the concentration of each dopant in the Al alloy in atomic parts per million (ppm). Specifically 10,000 ppm is equivalent to 1 at. %, 1000 ppm to 0.1 at. %, 100 ppm to 0.01 at. %, 10 ppm to 0.001 at. % and 1 ppm to 0.0001 at. %. As shown in FIG. 9, it was found that the most effective element for improving the thermal stability of the Al alloy submicron grains was Sc followed by Zr. Moreover only a small amount (about 100 ppm to 1,000 ppm) of Sc and Zr was needed to have a substantial effect on the thermal stability of the Al alloy.

As shown in FIG. 9, the submicron grain structure of an Al alloy having 1000 ppm Sc (5N Al having 0.1 at. % Sc (0.166 wt. %)) or Zr (5N Al having 0.1 at. % Zr (0.337 wt. %)) is stable up to 400° C. and 325° C. respectively. Above 1000 ppm (0.1 at. %) of either Sc or Zr, the increase in stability is more modest as more Sc or Zr is added, and the increase in stability reaches a plateau. This is likely because the maximum solubility of Sc and Zr in Al is less than 2,300 ppm and 2,800 ppm respectively. A concentration of Sc or Zr above these values will have less effect in creating extremely fine dispersoids, and as a result the added benefit on thermal stability is more gradual. As also shown in FIG. 9, elements such as Ti, Cu, and Si that may be used in certain heat treatable alloys have the least effect on thermal stability. Elements such as Hf, Mo, or Mn may contribute to the thermal stability of the Al alloy when present at fairly high concentrations (i.e. greater than 1000 ppm).

Figure 10:
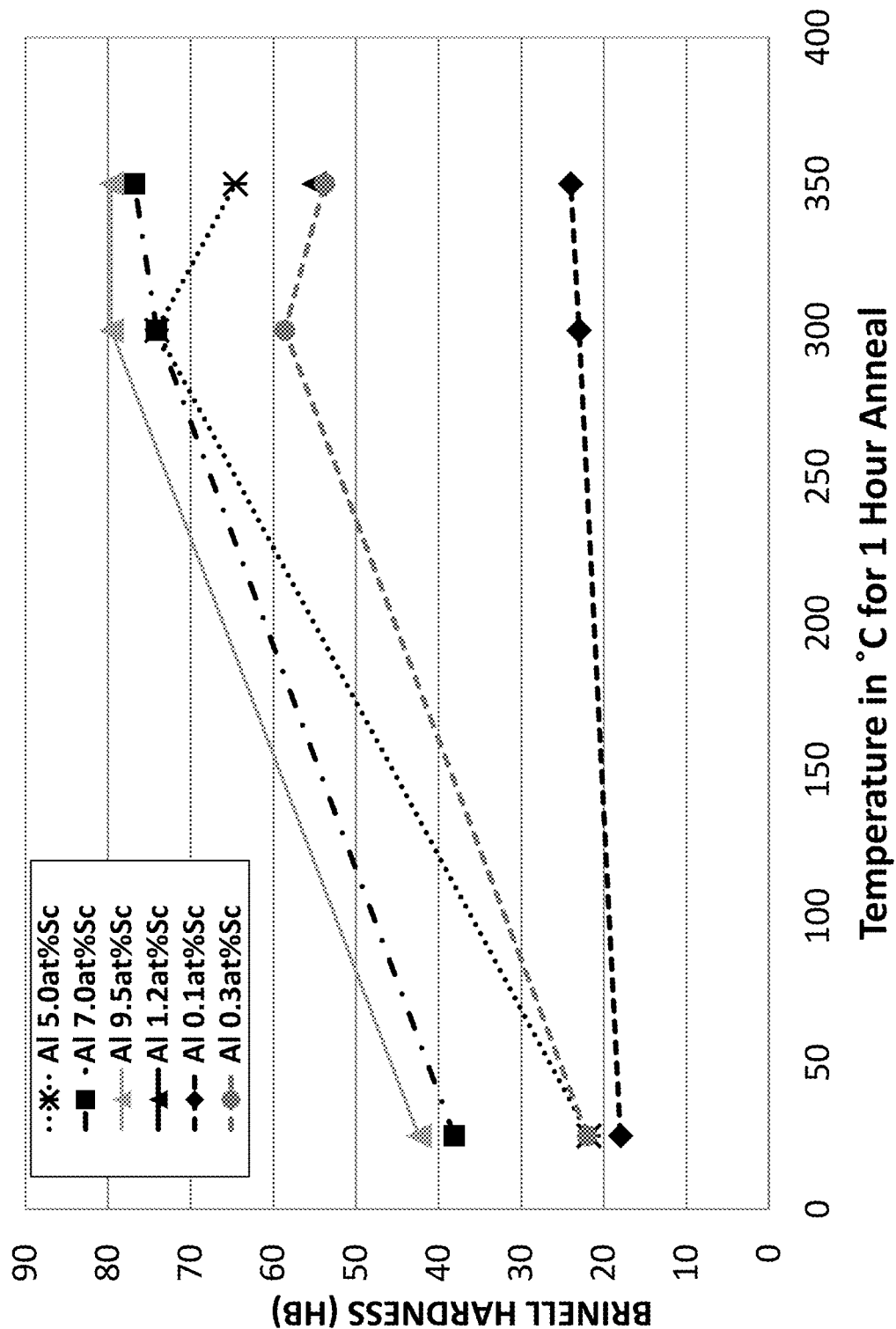
FIG. 10 is a graph comparing the composition of certain aluminum materials to hardness.

Example 2: Effect of Sc Weight Percentage in 99.999% Al (5N) on Brinell Hardness In this example, the effect of the amount of Sc on Al alloy hardness was evaluated. High purity 99.999% (5N) Al was doped to create six samples having Sc at atomic percentages of 0.1 at. % (0.166 wt. %), 0.3 at. % (0.5 wt. %), 1.2 at. % (1.98 wt. %), 5.0 at. % (8.06 wt. %), 7.5 at. % (11.90 wt. %) and 9.5 at. % (14.88 wt. %) Sc. For this example, a conventional thermo-mechanical process was selected. That is, standard plastic deformation including hot forging was used, rather than ECAE. The process used to form the materials for testing included casting the Al material, followed by solutionizing, quenching, and hot forging each cast at 250° C. to a 70% reduction in height to form a final billet of Al alloy. The billets were annealed at increasing temperatures. Measurements of the Brinnell hardness of the samples were conducted with the material at room temperature after annealing. The results are shown in FIG. 10 which shows the effect of Sc concentration on Brinell hardness at various annealing temperatures. The resulting average grain size for each sample after annealing at temperatures between 250° C. and 350° C. was from about 50 to about 150 microns.

As shown in FIG. 10, the threshold amount of Sc in Al for effective strengthening is above 0.1 at. % (0.166 wt. %) Sc. Also, in Al alloys having over 0.3 at. % (0.5 wt. %) Sc, the maximum increase in strength was attained after annealing at temperatures of 300° C. to 350° C. for 1 hour. These temperatures correspond to peak aging treatment for $Al_3Sc$ dispersoids.

As also shown in FIG. 10, the greatest increase in strength after annealing at 300° C. occurred between 0.1 at. % (0.166 wt. %) Sc and 0.3 at. % (0.5 wt. %) Sc which is just above the maximum solubility limit of Sc in Al which is 0.23 at. % (e.g. 2300 ppm or 0.38 wt. %). As shown in FIG. 10, the Brinnell hardness after being at 350° C. for 1 hour for 1.2 at. % (1.98 wt. %) Sc was very similar to 0.3 at. % (0.5 wt. %) Sc, which indicates a relatively minor difference between 0.3 at. %(0.5 wt. %) Sc and 1.2 at. % (1.98 wt. %) Sc. A more substantial increase in hardness was attained after adding a large amount of Sc (e.g. between 5.0 at. % (8.06 wt. %) and 9.5 at %(14.88 wt. %)). The hardness was augmented from 58.6 HB at 0.3 at. % (0.5 wt. %) Sc up to 79.6 HB with 9.5 at. % (14.88 wt. %) Sc. This result indicates that extremely fine $Al_3Sc$ dispersoids precipitated from the supersaturated 0.23 at. % (0.38 wt. %) Sc in solid solution have a more suitable strengthening effect than the various (AlSc) primary phases with excess Sc that were not affected by the various heat treatments including solutionizing, quenching, and peak aging at 300° C. to 350° C.

The maximum measured Brinell hardness was 79.6 HB for 9.5 at. % (14.88 wt. %) Sc which is still below the desired hardness of 92 HB, which corresponds to the desired tensile strength of 40 ksi for the Al alloy. This example demonstrated that conventional thermo-mechanical processing of Al—Sc alloys using standard plastic deformation is not sufficient in forming Al alloys of suitable hardness and/or strength even when an amount of Sc in excess of the solubility limit is used. One contributing factor to the relatively low hardness was the large (well over 1 micron) grain sizes developed during conventional thermos-mechanical processing. Another factor is the coarse size of the primary phases formed by Sc in excess of 0.38 wt. %, which does not contribute as effectively to strengthening as the dispersoids.

Note that Sc may have limited availability in some applications. Therefore, in some embodiments in which a high weight percentage of Sc is not available, lower amounts (e.g. less than 0.23 at. % (0.38 wt %)) of Sc may be used in conjunction with additional processing methods to attain a suitable hardness or yield strength. For example, an Al alloy with less than about 0.38 wt. % Sc and processed with various methods discussed above may have a similar hardness and/or yield strength to Al alloys with greater than about 0.38 wt. % Sc that are not processed with the above methods. Thus, in these circumstances, as disclosed above, additional processing techniques may be included to raise the hardness and/or strength of an Al alloy.

Example 3: Effect of Sc and Zr Concentration and Number of ECAE Passes on Al5083 Hardness In this example, the effect of various combinations of weight percentage of Sc and Zr on the Al alloy hardness was evaluated. The effect of the number of ECAE passes on the final Al alloy hardness was also evaluated.

Using the Sc concentrations found to be suitable in Examples 1 and 2, special Al materials were cast. In this example, a non-heat treatable commercial Al alloy, Al5083, was chosen as a base material. The composition of the initial Al5083 is given in Table 2 and is labeled "Actual." The Al5083 specification is also provided in Table 2 with the minimum and maximum acceptable weight percentage amounts for each element labeled "Minimum" and "Maximum" respectively. The composition contains conventional elements used in commercial Al alloys including Mg, Cr, Zn, Mn, Fe, Si and small amounts of Ti, Cu.

TABLE 2

Chemical Composition of Al5083 Used as Starting Material in Example 3

| Weight Percent | Si | Fe | Cu | Mn | Mg | Cr | Zn | Ti | Others Each | Others Total |
|---|---|---|---|---|---|---|---|---|---|---|
| Minimum |  |  |  | 0.4 | 4.0 | 0.05 |  |  |  |  |
| Maximum | 0.4 | 0.4 | 0.1 | 1.0 | 4.9 | 0.25 | 0.25 | 0.15 | 0.05 | 0.15 |
| Actual | 0.28 | 0.224 | 0.066 | 0.639 | 4.551 | 0.105 | 1.104 | 0.0234 | 0.0218 | 0.0621 |

Various amounts of Al having 2.0 wt. % Sc master alloy and Al having 10 wt. % Zr master alloy were melted together with Al5083 in a crucible. Three compositions with increasing amounts of Sc and/or Zr were produced and are referred to as Sample 1 (Al5083 having additional 0.2 wt. % Zr), Sample 2 (Al5083 having additional 0.3 wt % Sc and 0.2 wt % Zr) and sample 3 (Al5083 having additional 0.5 wt. % Sc and 0.2 wt. % Zr). The chemical composition of each of these cast alloys is listed in Table 3.

TABLE 3

Chemical Composition of Al5083 With Additional Dopants

| Weight Percent | Sc | Zr | Mg | Mn | Si | Fe | Cu | Cr | Zn |
|---|---|---|---|---|---|---|---|---|---|
| Sample 1 (Al5083 + 0.2 wt. % Zr) | 0.00 | 0.20 | 4.46 | 0.63 | 0.27 | 0.22 | 0.065 | 0.103 | 0.102 |
| Sample 2 (Al5083 + 0.3 wt. % Sc + 0.2 wt. % Zr) | 0.30 | 0.20 | 3.78 | 0.53 | 0.23 | 0.19 | 0.055 | 0.087 | 0.086 |
| Sample 3 (Al5083 + 0.5 wt. % Sc + 0.2 wt. % Zr) | 0.50 | 0.20 | 3.32 | 0.47 | 0.20 | 0.16 | 0.048 | 0.077 | 0.076 |

Note that different amounts of Al 2.0 wt. % Sc master alloy were added to each composition, which resulted in various degrees of dilution of the beginning elements contained in the initial base Al5083. In other words, the composition with the highest addition of Sc and Zr has also the lowest amount of Mg, Mn Fe, Si, Cr, Zn and Cu elements, as shown in Table 3.

After casting, samples 1-3 were solutionized at 550° C. for 24 hours. This temperature is 20° C. below the solidus temperature of the base material Al5083. Standard quenching in water was performed immediately after solutionizing. Warm ECAE extrusion was performed on billets of samples 1-3 either 1 time (1 pass) or 4 times (4 pass). The die and billet temperature was 200° C. Each billet was rotated by 90 degrees perpendicular to the extrusion direction between each pass. Following ECAE, coupons of each sample were cut from and annealed for 1 hour at the following specific temperatures: 200° C., 250° C., 300° C., 350° C. and 400° C.

A control sample was formed for comparison, using the Al5083 base material. The Al5083 base material was also subjected to ECAE at 200° C. with 1 pass and 4 pass and annealed for 1 hour at the same temperatures as samples 1-3.

Figure 11:
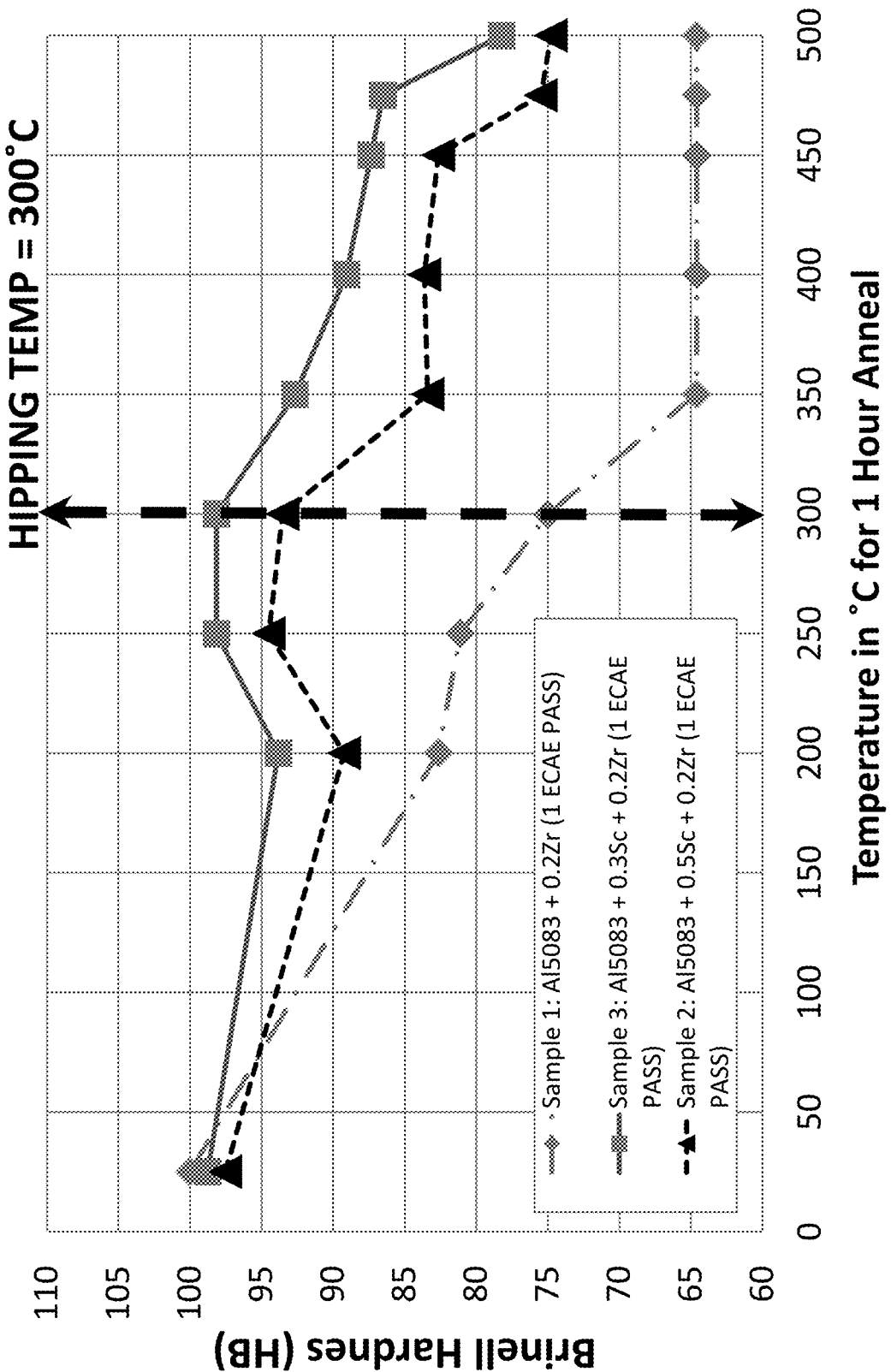
FIG. 11 is a graph comparing the hardness of certain aluminum materials as a function of annealing for one hour at various temperatures.

The results of a Brinell hardness test conducted with the material at room temperature for samples 1-3 after 1 ECAE pass are displayed in FIG. 11. The results of a Brinell hardness test conducted with the material at room temperature for samples 1-3 and the control sample after 4 ECAE passes are displayed in FIG. 12.

Figure 12:
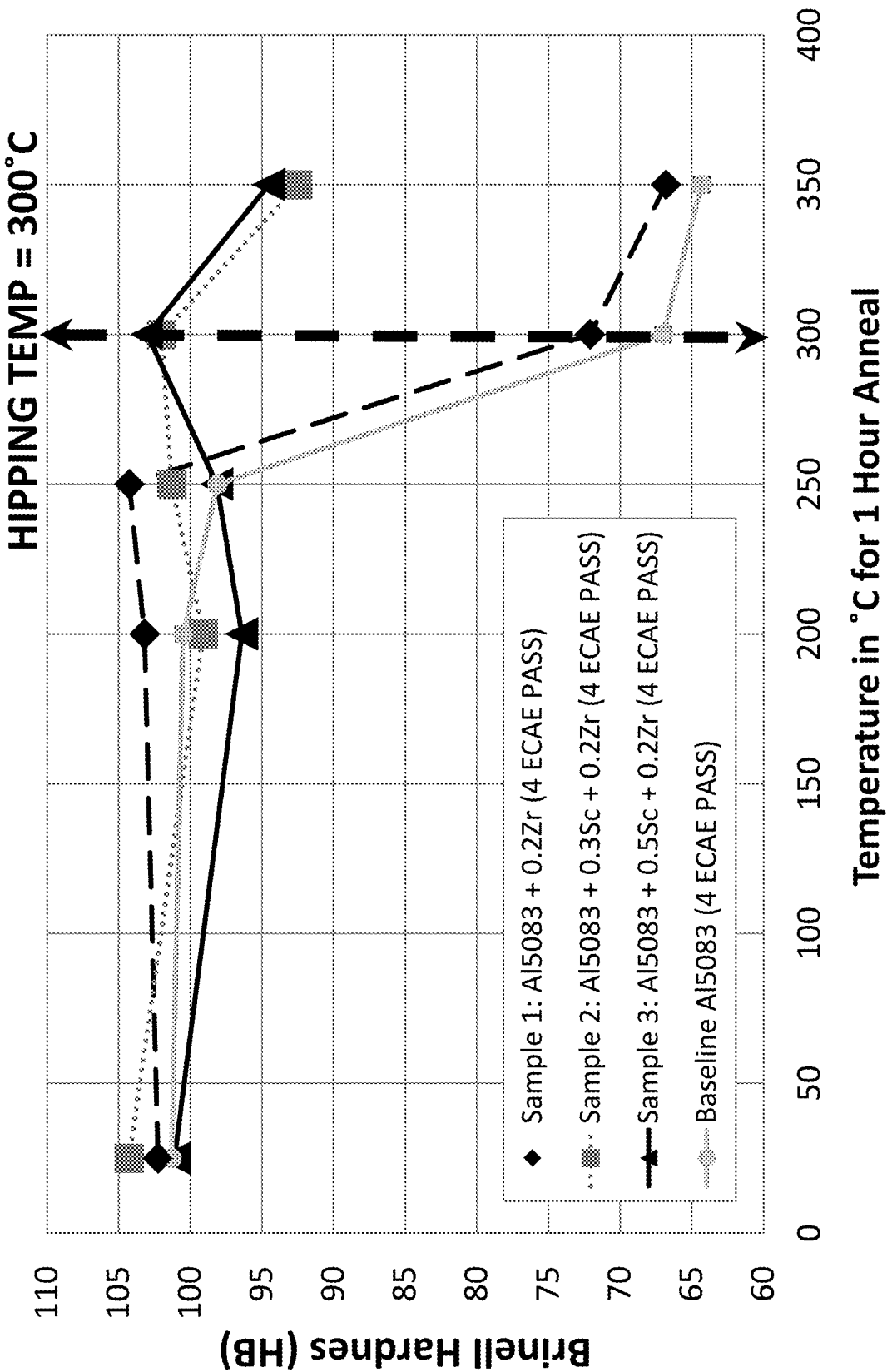
FIG. 12 is a graph comparing the hardness of certain aluminum materials as a function of annealing for one hour at various temperatures.

As shown in FIGS. 11 and 12, there is an increase in the thermal stability of the hardness even after the Al alloy has been heated to a temperature of 300° C. for 1 hour and to some extent at 350° C. This is shown by samples 2 and 3, and this trend is the same whether the samples are subjected to 1 or 4 ECAE passes. The resulting hardness is between 94-103 HB after samples 2 and 3 have been at 300° C. for 1 hour and between 84-94 HB after samples 2 and 3 have been at 350° C. for 1 hour. In contrast, as shown on FIG. 12, the base Al5083 and sample 1 have hardness levels below 74 HB after being annealed at 300° C. for 1 hour, and below 67 HB after being annealed at 350° C. for 1 hour, which is below the reference hardness value of 92 HB.

As shown in FIG. 12, for an annealing temperature range from 25° C. to 250° C., samples 1-3 all have a comparable level of hardness to the base material Al5083. At temperatures below 250° C., the base material Al5083 and sample 1 have the highest hardness. This shows that below 250° C. both Sc and likely also Zr do not participate in hardening. Instead, the standard alloy elements, Mg, Mn Fe, Si, Cr, Zn and Cu, contribute the most to the overall strength. At around 250° C., the effect of the dispersoids starts to manifest itself as can be best seen for the 1 pass ECAE samples in FIG. 11, where a noted increase in hardness is observed at 250° C. with a maximum at about 300° C. At these temperatures, $Al_3(Sc,Zr)$ dispersoids start to nucleate into very fine and uniformly distributed phases.

Figure 13A:
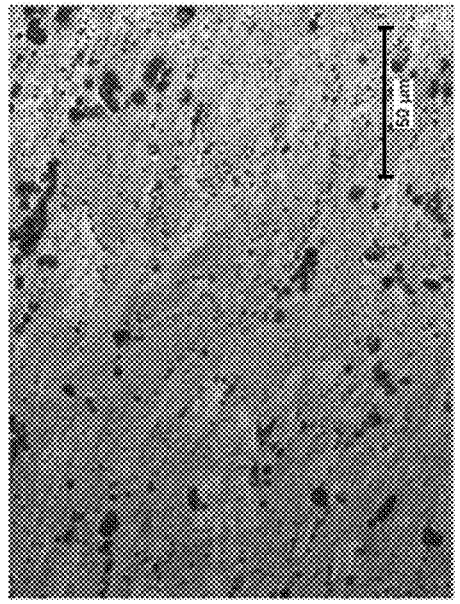
FIGS. 13A-13D are micrographs of various aluminum alloys taken with an optical microscope.
Figure 13B:
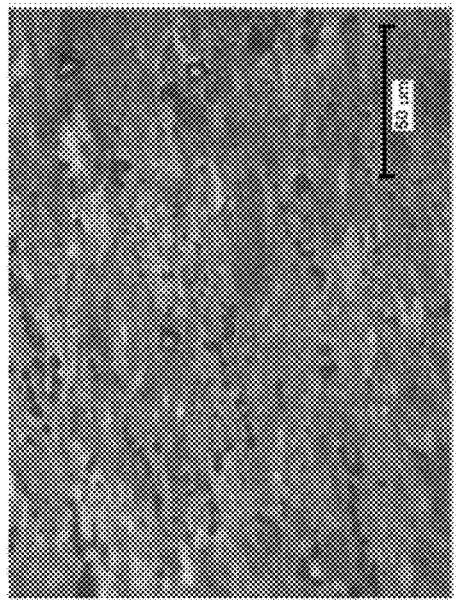
Figure 13C:
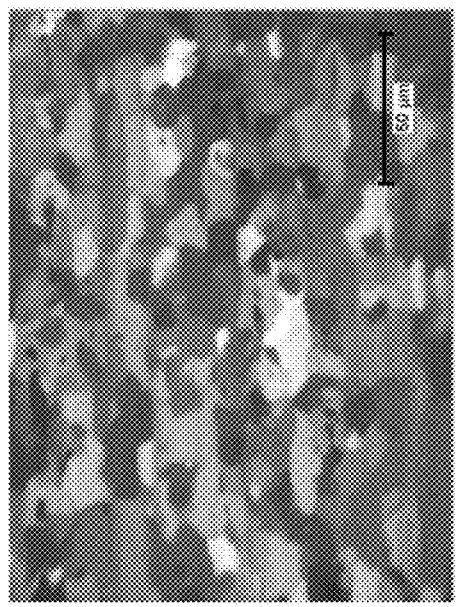
Figure 13D:
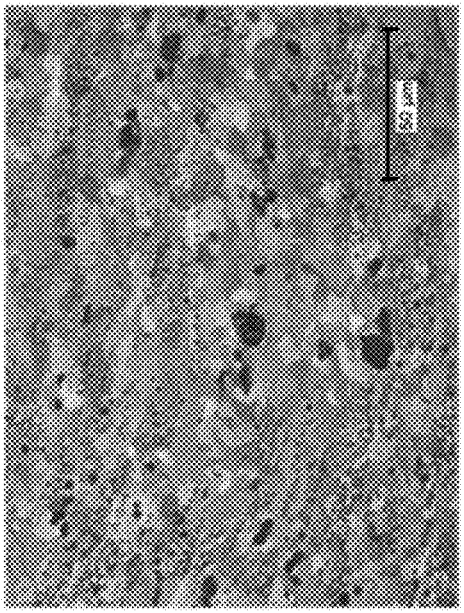
Figure 14A:
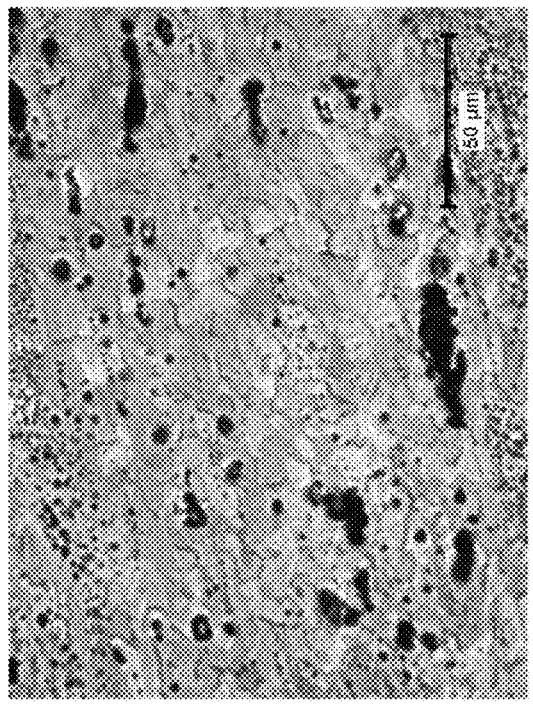
FIGS. 14A-14C are micrographs of various aluminum alloys taken with an optical microscope.
Figure 14B:
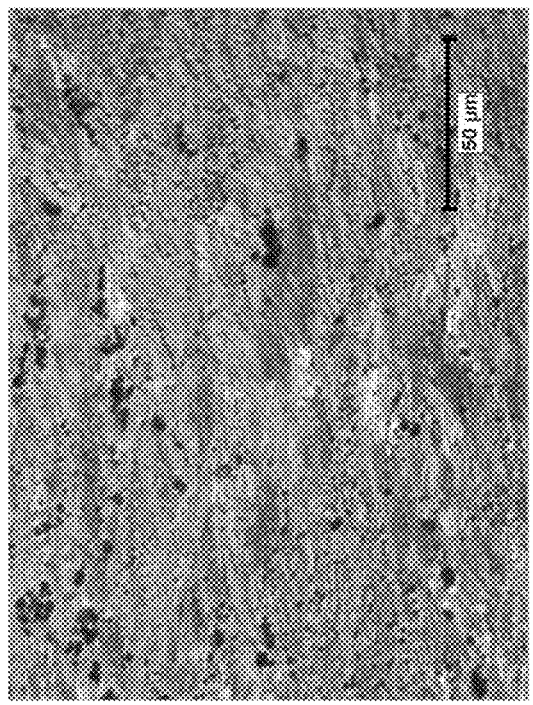
Figure 14C:
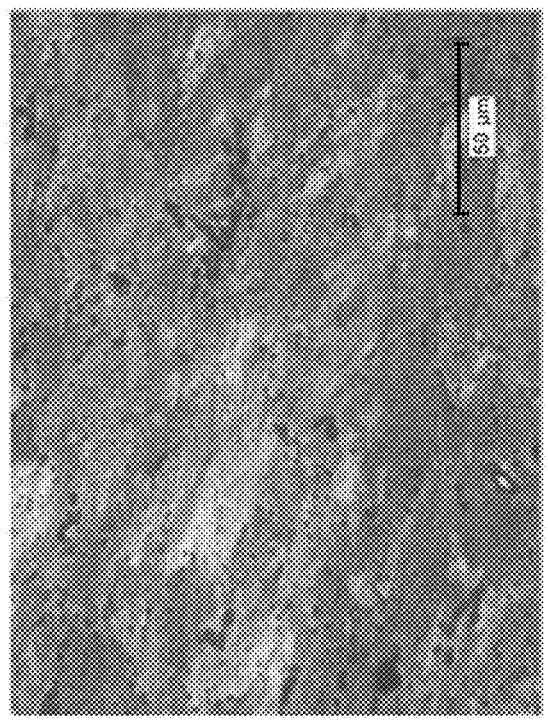

The grain size of the Al alloy for samples 1-3 at both 300° C. and 350° C. was evaluated by optical microscopy. Note that optical microscopy has a resolution of around 1 micron and can only resolve grain sizes above 1 micron. FIGS. 13A-13D contain photographs taken with an optical microscope of each Al alloy after heat treatment of 300° C. for 1 hour. FIGS. 14A-14C contain photographs taken with an optical microscope of samples 1-3 after heat treatment of 350° C. for 1 hour. Not that the scale on each of the photographs shows a range of about 50 μm. Grain size measurements are reported in Tables 4 and 5 below.

TABLE 4

Average Grain Size of Al Alloy After Heat Treatment at 300° C. for 1 Hour

|  | Baseline Al5083 (FIG. 13A) | Sample 1 (Al5083 + 0.2 wt. % Zr) (FIG. 13B) | Sample 2 (Al5083 + 0.3 wt. % Sc + 0.2 wt. % Zr) (FIG. 13C) | Sample 3 (Al5083 + 0.5 wt. % Sc + 0.2 wt. % Zr) (FIG. 13D) |
|---|---|---|---|---|
| Grain Size | 8.05 μm | 4.1 μm | Less than 1 μm | Less than 1 μm |

TABLE 5

Average Grain Size of Al Alloy After Heat Treatment at 350° C. for 1 Hour

|  | Sample 1 (Al5083 + 0.2 wt. % Zr) (FIG. 14A) | Sample 2 (Al5083 + 0.3 wt. % Sc + 0.2 wt. % Zr) (FIG. 14B) | Sample 3 (Al5083 + 0.5 wt. % Sc + 0.2 wt. % Zr) (FIG. 14C) |
|---|---|---|---|
| Grain Size | 4.5 μm | Less than 1 μm | Less than 1 μm |

As shown in FIGS. 13C, 13D, 14B, and 14C the submicron grain size of both samples 2 and 3 is stable as high as 300° C. and even as high as 350° C. In contrast, recrystallization has already occurred at 300° C. for the base material Al5083, shown in FIG. 13A, and generates an 8.05 micron grain size. For sample 1, as shown in FIG. 13B, the microstructure is almost fully recrystallized at 300° C. and yields a 4.1 micron grain size that remains mostly unchanged even after annealing at 350° C. as shown in FIG. 14A. This example shows the beneficial effect of Al(Sc,Zr) dispersoids on increasing the thermal stability of the submicron grain size of an Al alloy that has undergone ECAE. It also provides an explanation for the superior strength observed for samples 2 and 3 having Sc and Zr added.

Figure 15:
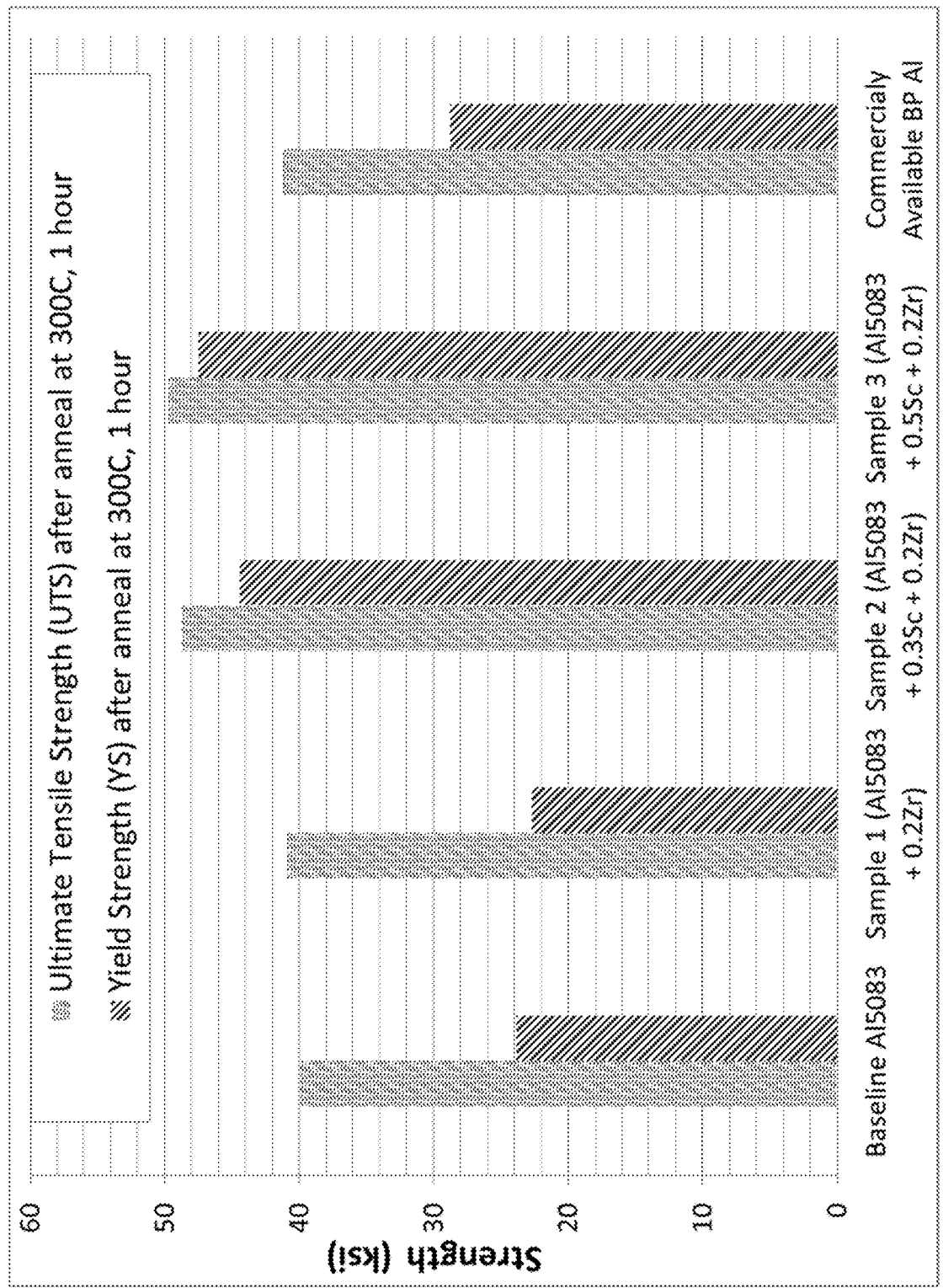
FIG. 15 is a graph comparing the strength of various aluminum alloys.

For samples 1-3 and the Al5083 base material, tensile testing was conducted with the samples at room temperature after the samples had been heat treated at 300° C. for 1 hour, which is similar to what a base plate material would be subjected to during HIPing. The results of the tensile testing are contained in FIG. 15. Data for a commercially available backing plate (BP) made of a heavily alloyed Al 5xxx is also included. FIG. 15 gives data for both ultimate tensile strength (UTS) and yield strength (YS) of the samples at room temperature after heat treatment at 300° C. for 1 hour. As shown in FIG. 15, samples 2 and 3 that contain both Sc and Zr have higher yield strength after annealing at 300° C. for 1 hour. Sample 2 had measured yield strength of 44.4 ksi, and sample 3 had measured yield strength of 47.5 ksi. This is in comparison to 23.8 ksi for the baseline Al5083, 22.7 ksi for sample 1, and 28.8 ksi for the commercially available backing plate Al. Gains in ultimate tensile strength (UTS) are also observed from about 40 ksi for the baseline Al5083 material up to 48.7 and 49.7 ksi for samples 2 and 3. As disclosed in this example, the method described herein provides an Al alloy that has a yield strength greater than greater than 40 ksi, greater than 45 ksi, or greater than 50 ksi after being at a temperature from about 300° C. to about 400° C. for at least one hour.

Figure 16:
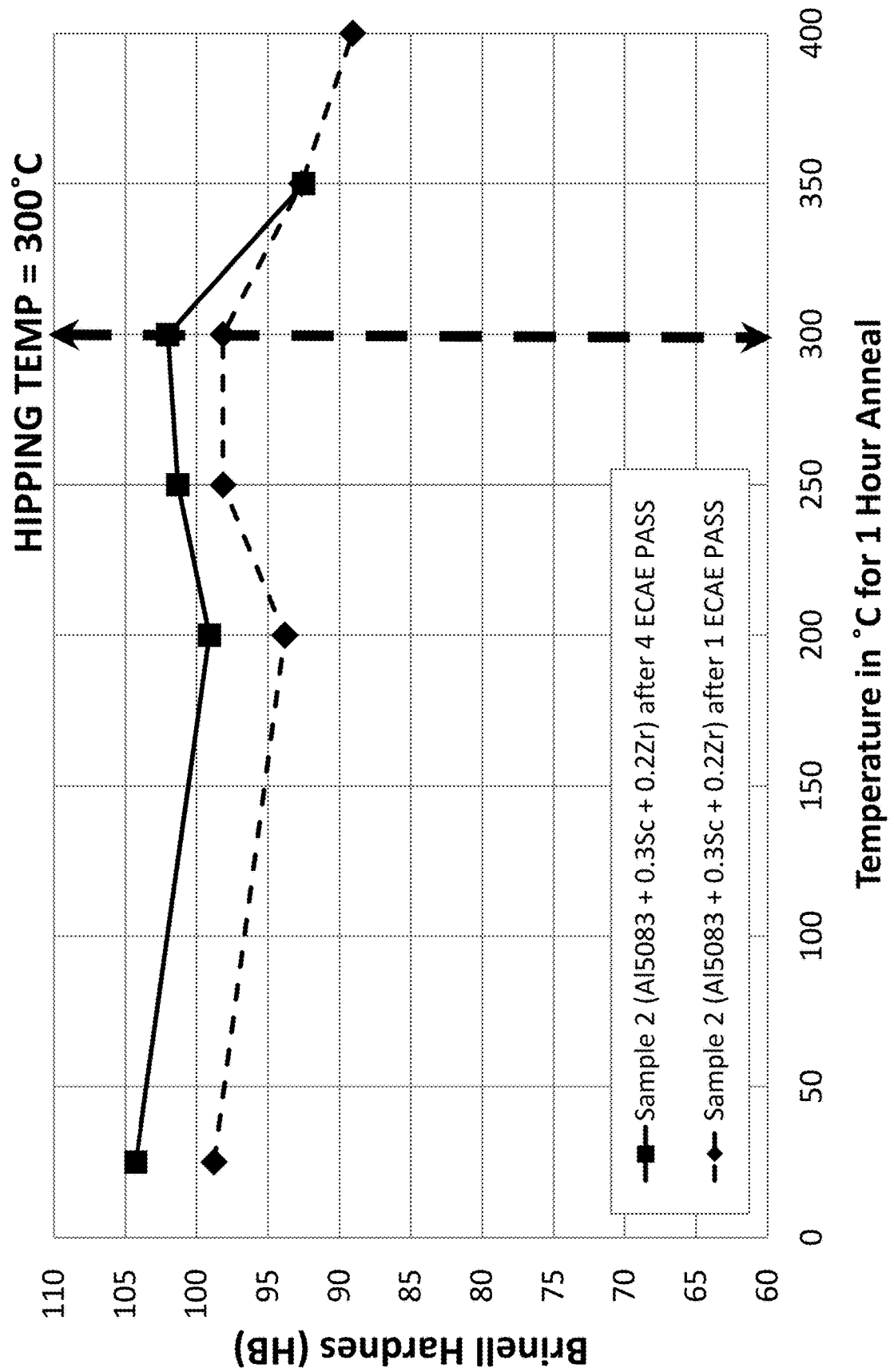
FIG. 16 is a graph comparing the hardness of certain aluminum alloys as a function of various annealing temperatures.
Figure 17:
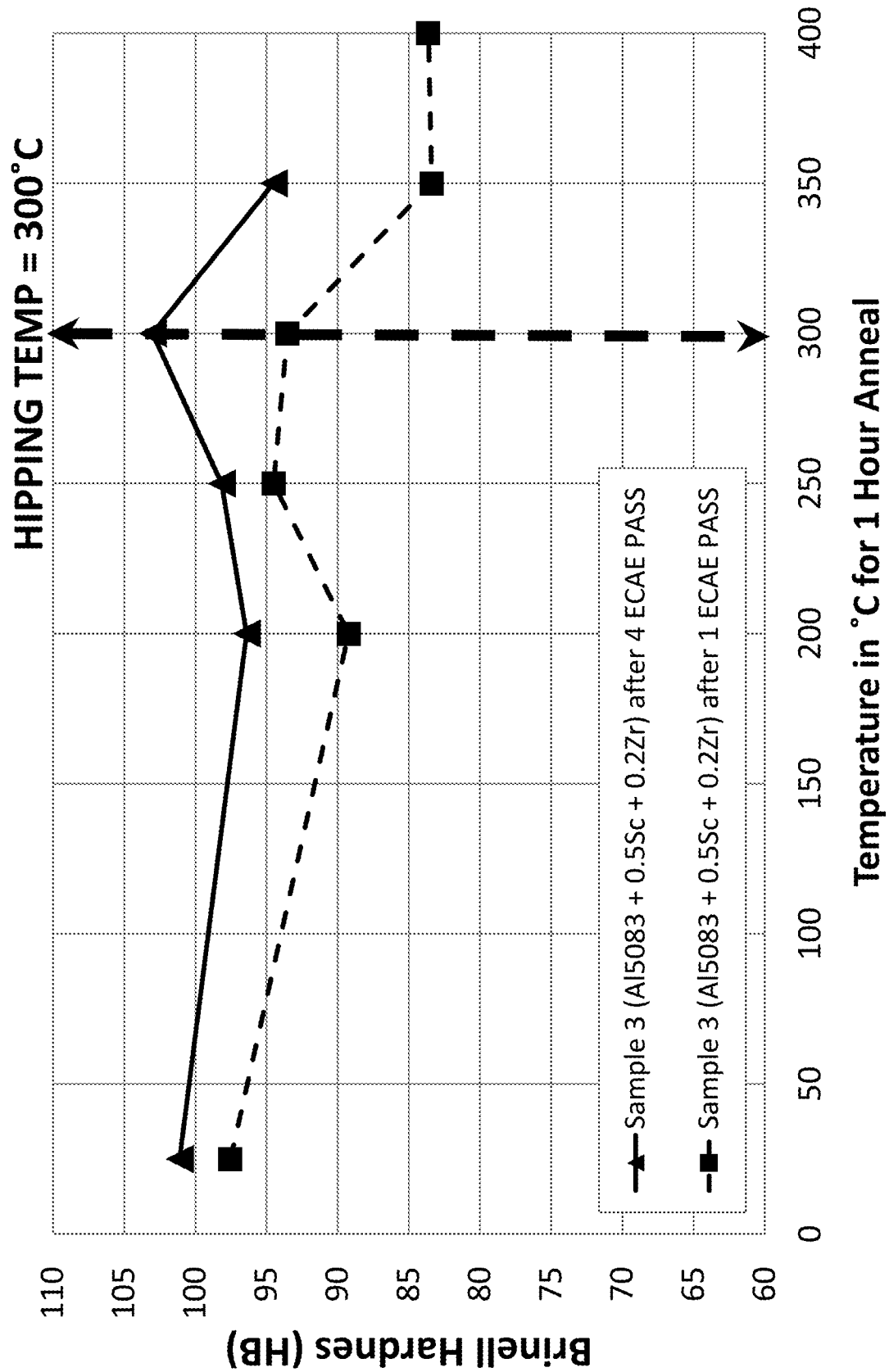
FIG. 17 is a graph comparing the hardness of certain aluminum alloys as a function of various annealing temperatures.

To compare the effect of the number of ECAE passes on hardness, the hardness for samples 2 and 3 subjected to both 1 and 4 ECAE passes was compared. FIG. 16 shows the Brinnell hardness of sample 2 after ungoing both 1 and 4 ECAE passes. FIG. 17 shows the Brinnell hardness of sample 3 after ungoing both 1 and 4 ECAE passes.

As shown in FIGS. 16 and 17, for samples 2 and 3, four ECAE passes resulted in a higher hardness for most temperature ranges. This was observed even at 25° C., on the left side of the graph in FIGS. 16 and 17. This also holds for samples 2 and 3 after being heated to temperatures of 300° C. For samples 2 and 3 that were subjected to 1 ECAE pass, after being at temperatures above 300° C. for one hour, the Brinell hardness began to fall below 92 HB. For samples 2 and 3 that were subjected to 4 ECAE passes, after being heated to 300° C. for one hour, the Brinell hardness remains above 102-103 HB. For samples 2 and 3 that were subjected to 4 ECAE passes, even after being at temperatures of about 350° C. for one hour, the Brinell hardness remains above 92 HB, which is the reference hardness for Al alloys for backing plate applications.

Example 4: Effect of Long Term Annealing at 300° C. and 350° C. after 1 ECAE Pass for Al5083 with Sc and/or Zr In this example, the effect of long term exposure to temperatures similar to standard annealing temperatures was evaluated. The same material used in samples 1-3 and the base material in example 3 above were evaluated.

Figure 18:
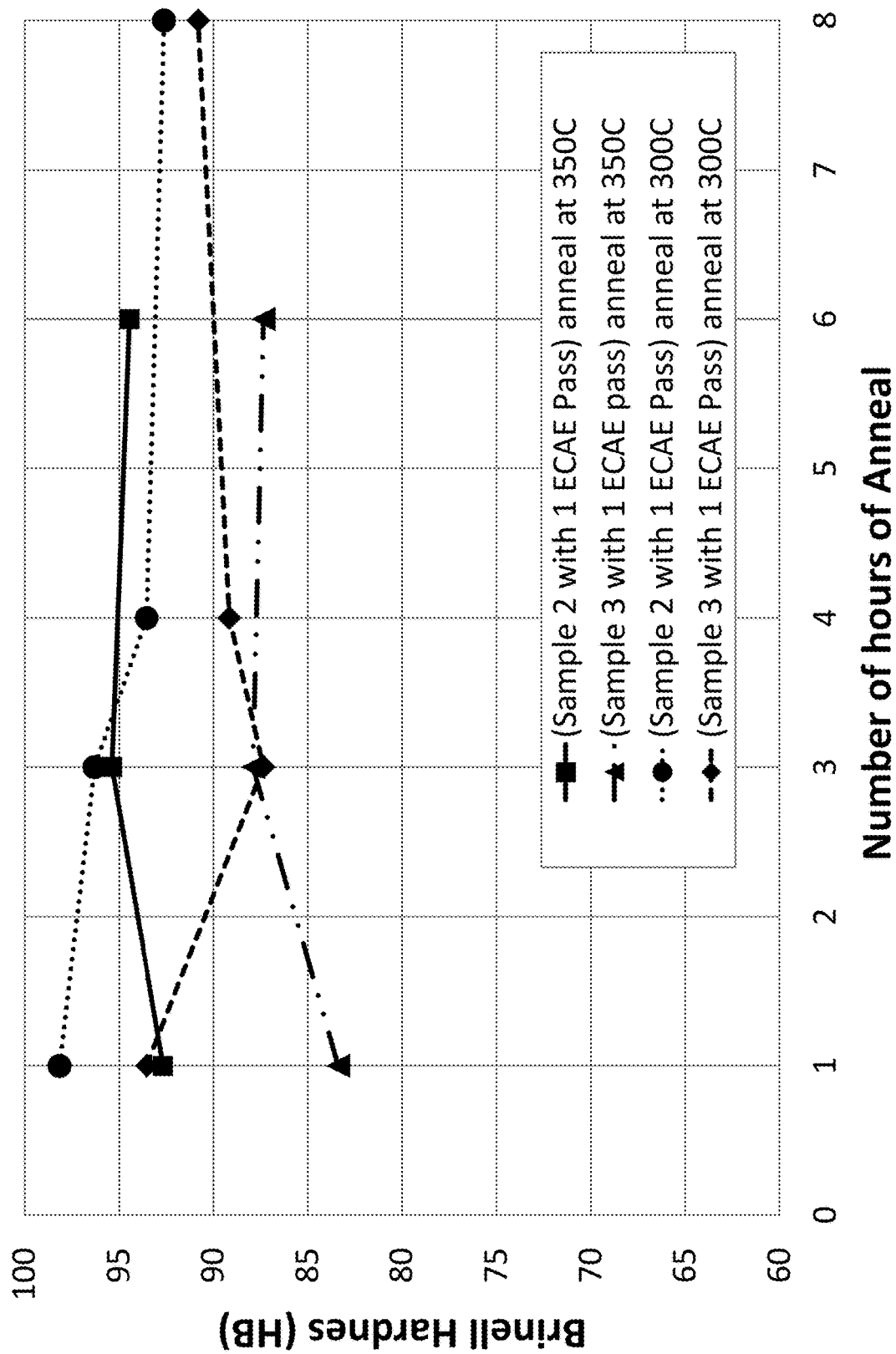
FIG. 18 is a graph comparing the hardness of certain aluminum alloys as a function of various annealing times and temperatures.
Figure 19:
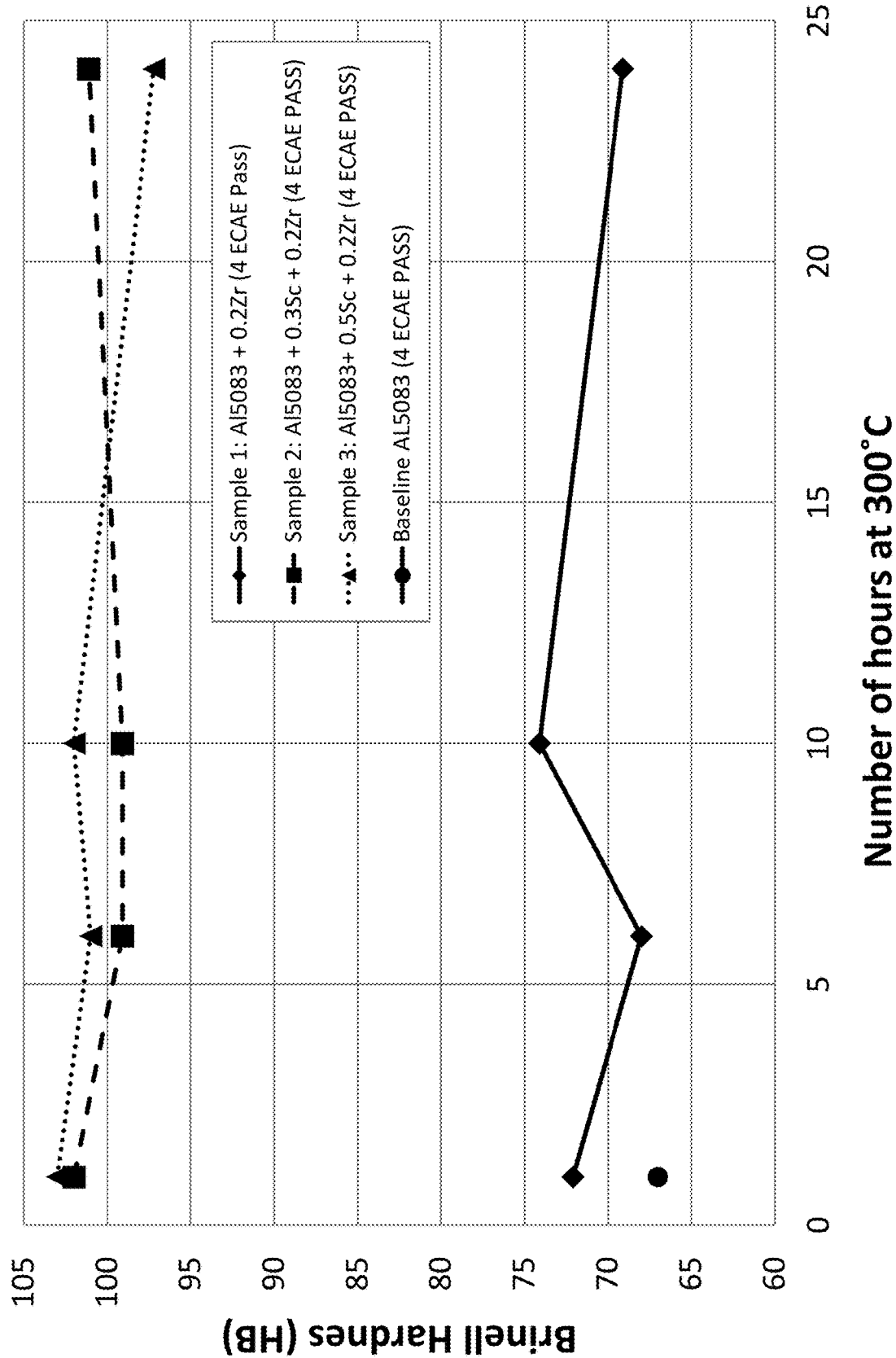
FIG. 19 is a graph comparing the hardness of certain aluminum alloys after being heated for various durations.

FIG. 18 shows the measured hardness after long term annealing treatments. FIG. 18 shows the hardness of material from samples 2 and 3 after being subjected to 1 ECAE pass, and for increasing duration at both 300° C. and 350° C. between 1 and 8 hours. This type of testing is done to determine how robust the process envelope for heat treatment is and the effect of long term heating on the Al alloy's mechanical properties. FIG. 19 shows the hardness of the material from the baseline Al5083 alloy and material from samples 1-3 after 4 ECAE passes after heating to 300° C. for between 1 and 24 hours.

As shown in FIG. 19, after being heated to 300° C. for up to 24 hours, no marked decrease in Brinell hardness was detected in samples 2 and 3 after 4 ECAE passes. The data show the Brinell hardness consistently remained above 97 HB, which is above the desired limit of 92 HB for Al alloys used in backing plate applications. As shown in this example, variations in the duration of a thermal processing step such as hipping may have diminished effect on the resulting mechanical properties of an Al alloy backing plate made with the compositions of samples 2 and 3. This example shows that a backing plate made from the Al alloys disclosed here can withstand longer hipping times without losing hardness. This property allows a longer hipping time to be used for bonding backing plates made with the Al alloys described in the instant application to sputtering targets, and thus allows a sputtering target assembly to be formed with a higher quality bond.

Comparing the hardness values in FIG. 18 to those in FIG. 19, it can be observed that using 4 ECAE passes instead of 1 ECAE pass results in less decrease in hardness over long annealing times. As shown in FIG. 18, for an Al alloy having a composition similar to sample 3 and subjected to 1 ECAE pass, the Brinell hardness remains below 92 HB after being at a temperature of 300° C. for 8 hours. However, as shown in FIG. 19, for an Al alloy having a composition similar to sample 3 and subjected to 4 ECAE passes, the Brinell remains above 92-93 HB even after being at a temperature of 300° C. This demonstrates the effect of the number of ECAE passes on the submicron structure. More ECAE passes provides a more equiaxed, refined, and uniform submicron grain size with a larger number of high angle boundaries. High angle boundaries make the structure more stable and likely also influence the precipitation dynamics and repartition of dispersoids.

As also shown in FIG. 18, it has been found that the strength of samples 2 and 3 that underwent 1 ECAE pass may increase after the samples are at a temperature of 350° C. for about 3 hours. For the sample 2 material, a Brinell hardness above 94 HB was attained. This datum suggests a wider range of processing parameters that can be used in a HIPing process, including heating an Al alloy to temperatures higher than 300° C., potentially up to 350° C., for suitable HIPing times. This may further result in beneficial bond strength and microstructures for particular target assembly compositions. Note that minimal benefit was observed for sample 1 having Zr alone or the baseline Al5083 material after long term annealing.

Example 5: Effect of Composition on Thermal Stability on Al5456 with Sc and/or Zr after 4 ECAE Passes In this example, the effect of composition on the hardness of a non-heat treatable Al alloy was evaluated.

Based on the principles described in examples 1 and 2 and the methods described in example 4, a new set of four Al alloys was cast by ingot metallurgy. In this example, the base material was non-heat treatable Al alloy Al5456, the composition of which is given in Table 3 and is labeled "Actual." The Al5456 specification is also provided in Table 6 with the minimum and maximum acceptable weight percentage amounts for each element labeled "Minimum" and "Maximum" respectively. This Al alloy contains more Mg (the main alloying element) than Al5083 in Example 3 above. The remaining conventional elements are similar to Al5083, namely Mn, Fe, Cr, Si and small amounts of Zn, Ti, and Cu.

TABLE 6

Chemical Composition of Al5456 Used as Starting Material in Example 5

| Weight Percent | Si | Fe | Cu | Mn | Mg | Cr | Zn | Ti | Others Each | Others Total |
|---|---|---|---|---|---|---|---|---|---|---|
| Minimum |  |  |  | 0.5 | 4.7 | 0.05 |  |  |  |  |
| Maximum | 0.25 | 0.4 | 0.1 | 1.0 | 5.5 | 0.2 | 0.25 | 0.2 | 0.05 | 0.15 |
| Actual | 0.117 | 0.158 | 0.09 | 0.663 | 5.239 | 0.084 | 0.013 | 0.0207 | 0.0147 | 0.0445 |

Similar to the process followed in Example 3, an Al+2.0 wt. % Sc master alloy and an Al+10 wt. % Zr master alloy were melted together with baseline Al5456 material to produce 4 compositions listed in Table 7 as samples 4-7. The composition in weight percentage of each material is given in Table 7. For 3 of the 4 new alloys (samples 5-7), 3 levels of Sc that are below, near and slightly above the maximum solubility limit of Sc in Al (e. g. 0.2 wt. %, 0.3 wt. % and 0.5 wt. %) were added while Zr was kept constant at 0.2 wt %. For the fourth alloy (sample 4), only 0.3 wt. % Sc (near the maximum solubility limit) was added, and no Zr was added.

TABLE 7

Chemical Composition of Al5456 With Additional Dopants

| Weight Percent | Sc | Zr | Mg | Mn | Si | Fe | Cu | Cr | Zn |
|---|---|---|---|---|---|---|---|---|---|
| Sample 4 (Al5456 + 0.3 wt. % Sc) | 0.30 | 0.0 | 4.43 | 0.56 | 0.099 | 0.134 | 0.007 | 0.071 | 0.0110 |
| Sample 5 (Al5456 + 0.2 wt. % Sc + 0.2 wt. % Zr) | 0.20 | 0.20 | 4.58 | 0.58 | 0.102 | 0.138 | 0.007 | 0.073 | 0.0114 |
| Sample 6 (Al5456 + 0.3 wt. % Sc + 0.2 wt. % Zr) | 0.30 | 0.20 | 4.31 | 0.55 | 0.096 | 0.130 | 0.008 | 0.069 | 0.0107 |
| Sample 7 (Al5456 + 0.5 wt. % Sc + 0.2 wt. % Zr) | 0.50 | 0.20 | 3.79 | 0.48 | 0.085 | 0.114 | 0.007 | 0.061 | 0.0094 |

Similar to the samples in Example 3, there was some dilution of the main elements of Al5456 due to the addition of different amounts of master alloy for each new composition. In other words compositions using more master alloy had less quantities of conventional elements Mn, Fe, Cr, Si, Zn, Ti, Cu.

After casting the Al materials into billets, samples 4-7 were solutionized at 554° C. for 24 hours (i.e. 20° C.) below the solidus temperature of the base material Al5456 to form an Al alloy. Standard quenching in water was immediately performed after the solutionizing. Warm ECAE extrusion of samples 4-7 was performed 4 times (4 ECAE pass) using a 90 degree billet rotation between each pass. The die and billet temperature were kept at 200° C. Following ECAE, coupons were cut from the material of samples 4-7 and annealed for 1 hour at the following temperatures: 200° C., 250° C., 300° C., 350° C., 400° C., 450° C. and 500° C.

For comparison, the non-heat treatable Al5456 base material was also ECAE extruded at 200° C. using 4 passes and annealed for 1 hour at the same temperatures as samples 4-7. Brinell hardness tests were conducted and the results are shown in FIG. 20.

Figure 20:
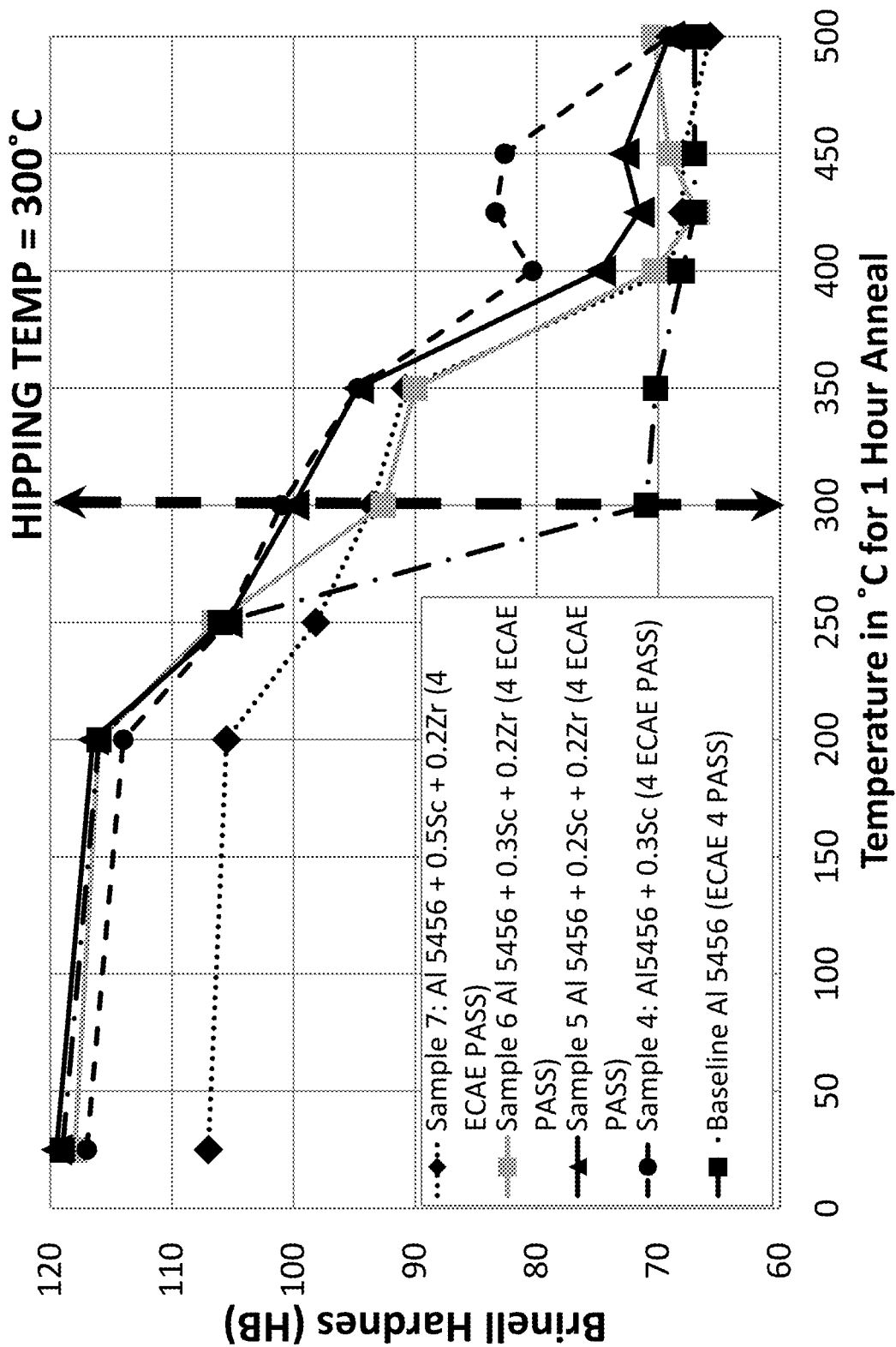
FIG. 20 is a graph comparing the hardness of certain aluminum alloys after being heated for various temperatures.

As shown in FIG. 20, all of samples 4-7 exhibited a Brinell hardness over 92 HB after being heated to temperatures about 300° C. and met the requirements for use as an Al alloy backing plate according to the parameters disclosed above. As also shown in FIG. 20, the sample compositions with the best thermal stability and strength are samples 4 and 5. At 300° C., the Brinell hardness of both compositions is 100-101 HB and at 350° C., it remains at about 94.7 HB (i.e. over 92 HB). The superior hardness of those two compositions is seen even after being heated to temperatures between 400° C. and 500° C.

As also shown in FIG. 20, for samples 6 and 7, the addition of 0.3 wt. % Sc or 0.5 wt. % Sc did not provide a significant advantage compared to 0.2 wt. % Sc when comparing the samples 5-7, all of which have both Sc and Zr added. The Brinell hardness changes for samples 6 and 7 were similar between temperatures from 300° C. to 450° C. This may be related to the fact that about the same amount of Sc (likely less than 0.38 wt. %) precipitated in both compositions because 0.3 wt. % is near the maximum solubility limit of 0.38 wt. % and 0.5 wt. % is slightly above it. This data may indicate that longer solutionizing heat treatments or faster cooling methods result in a greater amount of Sc dissolved in the Al.

FIGS. 21A-21B, 22A-22C, and 23A-23C show the grain sizes of samples 4, 5, and 7 photographed with optical microscopy. Sample 6 is not shown because it was similar to samples 5 and 7. The data from FIGS. 21A-21B, 22A-22C, and 23A-23C is summarized in Table 8.

TABLE 8

Summary of Data from FIGS. 21A-21B, 22A-22C, and 23A-23C

Figure 21B:
FIGS. 21A-21B are micrographs of aluminum alloys after heating to various temperatures, taken with an optical microscope.
Figure 21A:
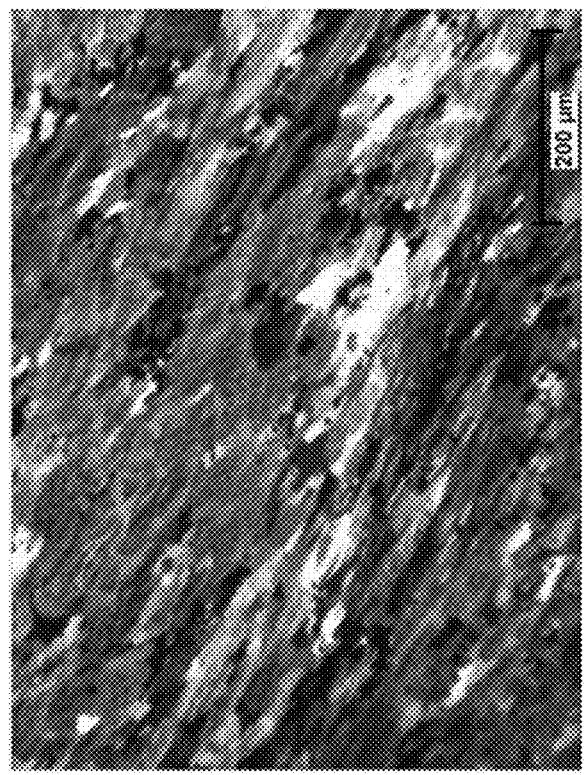
Figure 22B:
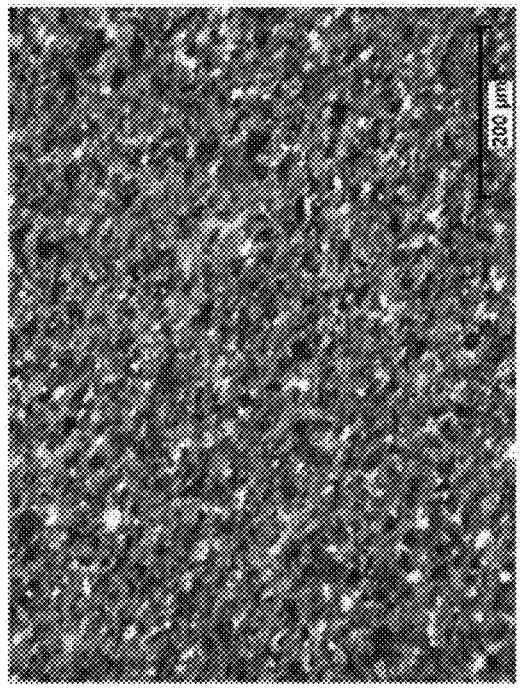
FIGS. 22A-22C are micrographs of aluminum alloys after heating to various temperatures, taken with an optical microscope.
Figure 22C:
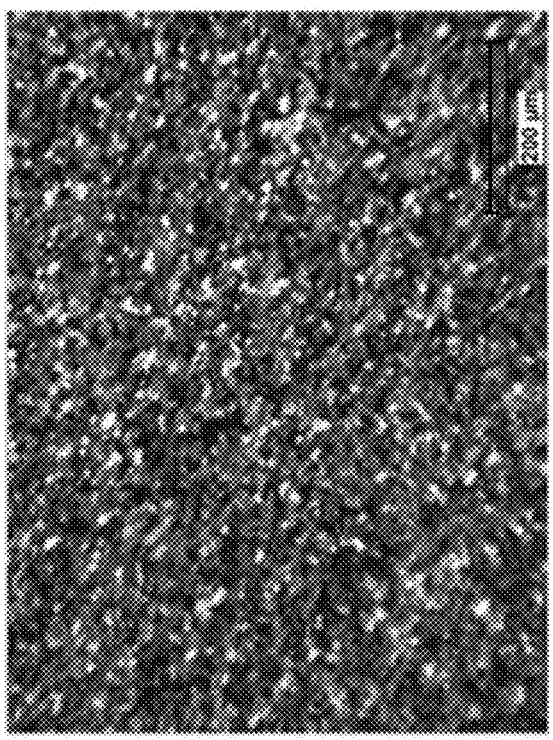
Figure 22A:
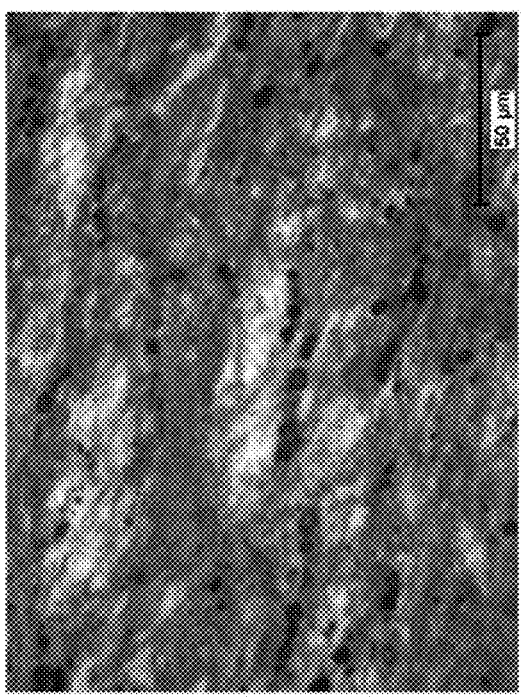
Figure 23B:
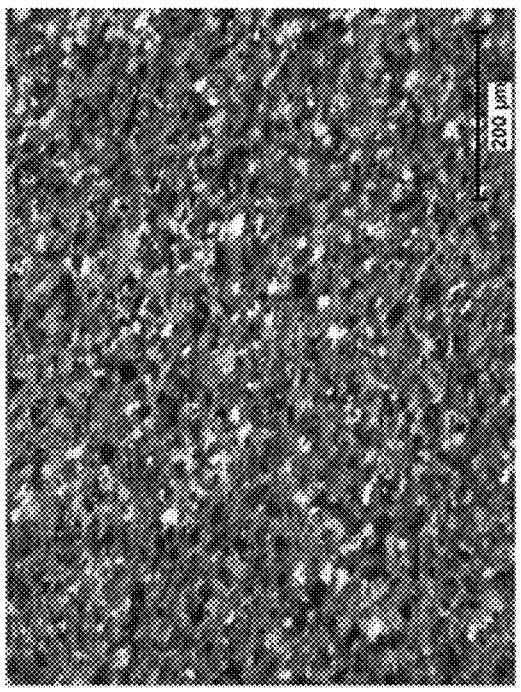
FIGS. 23A-23C are micrographs of aluminum alloys after heating to various temperatures, taken with an optical microscope.
Figure 23C:
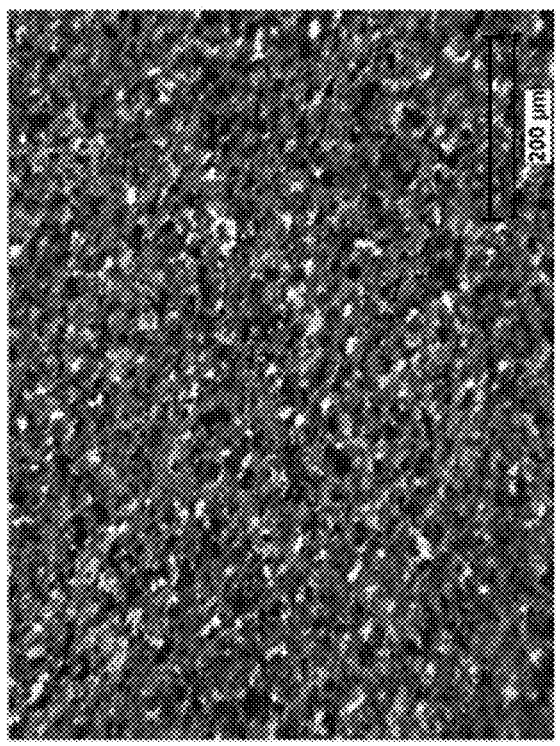
Figure 23A:
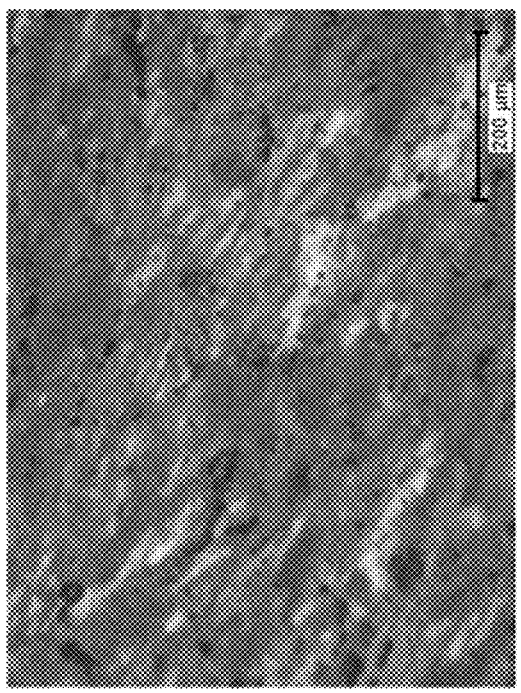

| FIG. | Sample (Al 5646+) | Annealing Temperature | Grain Size | Observations |
|---|---|---|---|---|
| FIG. 21A | 4 (0.3 wt. % Sc) | 400° C.-1 hour | Less than 1 μm | Submicron |
| FIG. 21B | 4 (0.3 wt. % Sc) | 450° C.-1 hour | 15-18 μm | Fully recrystallized |
| FIG. 22A | 5 (0.2 wt. % Sc, 0.2 wt. % Zr) | 350° C.-1 hour | Less than 1 μm | Submicron |
| FIG. 22B | 5 (0.2 wt. % Sc, 0.2 wt. % Zr) | 400° C.-1 hour | 6.5 μm | Fully recrystallized |
| FIG. 22C | 5 (0.2 wt. % Sc, 0.2 wt. % Zr) | 500° C.-1 hour | 6.5 μm | Fully recrystallized |
| FIG. 23A | 7 (0.5 wt. % Sc, 0.2 wt. % Zr) | 350° C.-1 hour | Less than 1 μm | Submicron |
| FIG. 23B | 7 (0.5 wt. % Sc, 0.2 wt. % Zr) | 400° C.-1 hour | 8.25 μm | Fully recrystallized |
| FIG. 23C | 7 (0.5 wt. % Sc, 0.2 wt. % Zr) | 500° C.-1 hour | 6.8 μm | Fully recrystallized |

As shown in FIGS. 21A-21B, 22A-22C, and 23A-23C, the compositions of all samples had submicron grain sizes up to at least 300° C. and even up to 350° C. Sample 4, with only 0.3 wt. %. Sc had a heightened stability of submicron grain size up to 425° C. with recrystallization happening only at around 425° C. Samples 5 and 7 have a fully recrystallized and fine (i.e. less than 10 microns in diameter) microstructure at 400° C. This data shows that the submicron grain size participated in strengthening the Al alloy at 300° C. and also 350° C. It also demonstrates the effectiveness of dispersoids to pin down grain boundaries and retard grain growth.

In summary, Example 5 shows that the process employed in Example 3 for Al5083 also works well for Al5456. As disclosed herein, these techniques can be used to combine an Al alloy with certain suitable dispersoids and forming submicron microstructures obtained by severe plastic deformation to any sufficiently alloyed Al alloy. This includes for example choosing as a starting material an Al alloy from the 1000 to the 8000 series. In general, a wide variety of compositions or elements can be used for the base Al alloy or dispersoids, and can be used to develop high temperature properties according to the methods disclosed herein. This may allow a wide range of Al materials to be used to form Al alloys having specifically tailored properties, and to form materials that are not currently available. Elements other than Al that form dispersoids with elements such as Sc, Zr, Ti, Nb, Ni, Y, Hf, V, Fe, Li, Mn, Cr, Ta, Ce, Pr, Nd, Pm, Sm, Eu, Gd, Tb, Dy, Ho, Er, Tm, Yb, and Lu can be combined for alternative applications.

Figure 24:
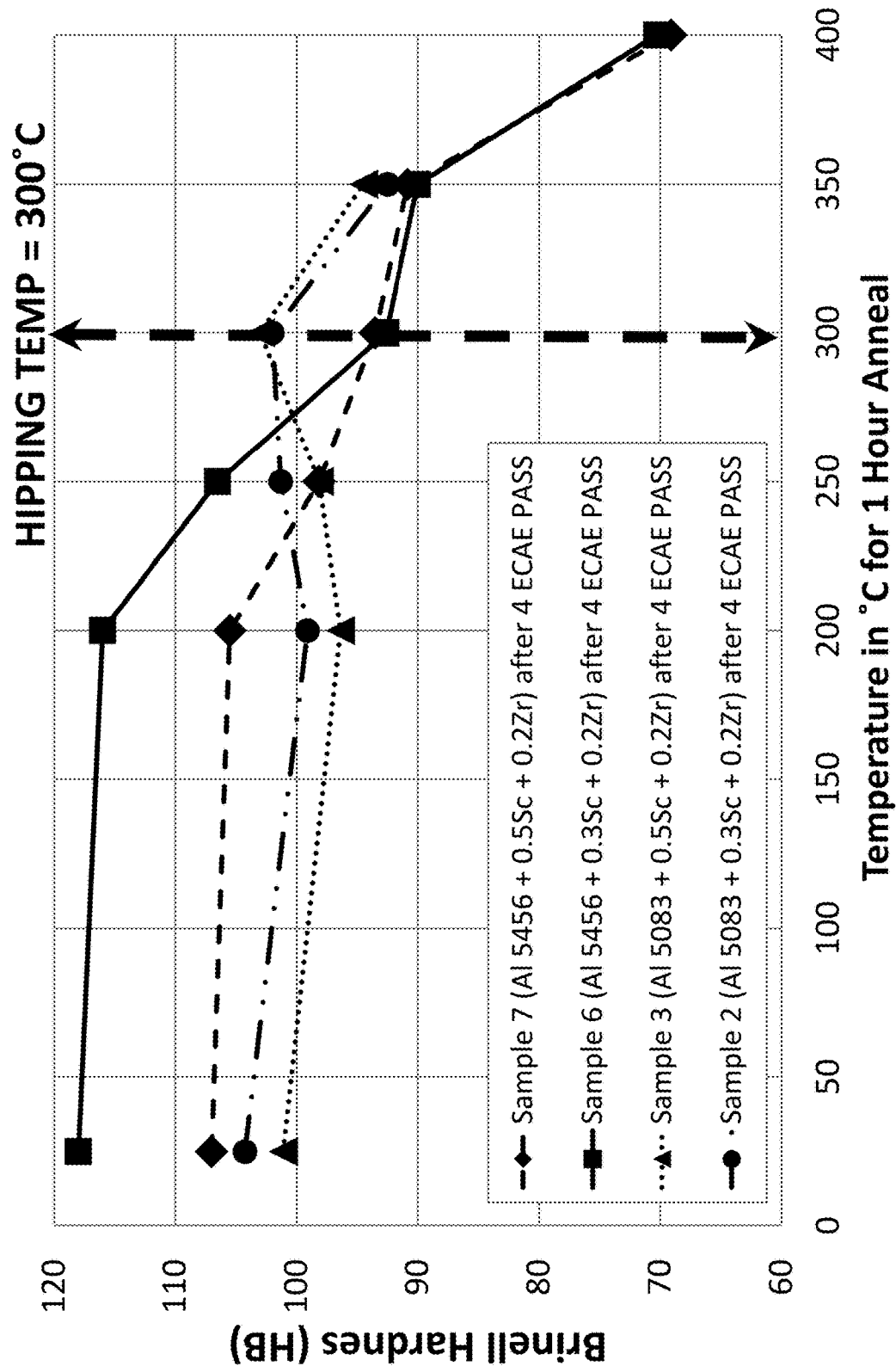
FIG. 24 is a graph comparing the hardness of certain aluminum alloys at various temperatures.

Example 6: Effect of Initial Composition on Al5456 and Al5083 with Added Sc and/or Zr FIG. 24 compares the data for Brinell hardness versus annealing temperature for similar levels of Sc and Zr alloying, namely 0.5Sc+0.2Zr and 0.3 Sc+0.2Zr, for the 2 base materials, Al5083 and Al5456, described in examples 3 and 5. FIG. 24 also shows a comparison of samples 2 and 3 from Example 3, and samples 6 and 7 from Example 5 after being subjected to 4 ECAE passes.

As shown in FIG. 24, Al5456 baseline material provides harder materials at temperatures below 250° C. but there is minimal benefit at 300° C., which is the temperature of interest for sputtering target assemblies. This leveling off of hardness at temperatures approaching 300° C. illustrates the following point. At temperatures below 250° C., the dominant strengthening mechanisms are hardening from submicron grain sizes, hardening from solute, insoluble phases and soluble secondary phases of transition elements, but not dispersoids. For these two compositions, the difference in Mg is a strong contributor to the strength of the materials used to make these two samples. Because there is more Mg in the 2 Al5456 based samples versus the 2 Al5083 based samples (3.79%-4.31% versus 3.32%-3.78%—see Tables 3 and 7 for the compositions of these samples), hardness is higher in the 2 former compositions. At about 250° C., three phenomena start to take place: loss of strength coming from conventional elements, recovery of dislocations with a small growth of the submicron grain size, and the nucleation of the $Al_3$(Sc, Zr) dispersoids. The first two factors contribute to the hardness loss to about the same level for all four compositions. But the last phenomenon, namely the nucleation of dispersoids increases the Al alloy strength and stops any further grain growth. At 300° C., peak aging of dispersoids takes place and provides and acceptable strength to all four compositions.

Overall this comparison shows there are limits to the amount of conventional elements, (e.g. Mg) that can be used to improve certain material properties at temperatures as high as 300° C. Factors for strengthening remain the size and distribution of dispersoids and the submicron grain sizes.

As also shown in FIG. 24, for samples 2 and 3 which had the most suitable compositions, 4 ECAE passes resulted in a higher hardness for all studied temperature ranges. This includes temperatures as high as 300° C. and 350° C. At 300° C. for one hour, the Brinell hardness remains above 102-103 HB. Even at 350° C. for one hour it remains above 92 HB, which is the desired hardness for Al alloys for backing applications according to the methods of the instant disclosure. As shown in the above examples, the methods described herein may be used to form an Al alloy that has a Brinnell hardness greater than 80 HB, greater than 85 HB, or greater than 90 HB after being at a temperature from about 300° C. to about 400° C. for at least one hour.

Various modifications and additions can be made to the exemplary embodiments discussed without departing from the scope of the present invention. For example, while the embodiments described above refer to particular features, the scope of this invention also includes embodiments having different combinations of features and embodiments that do not include all of the above described features.

The following is claimed:

1. A method of forming a high strength aluminum alloy for use in a sputtering assembly backing plate, the method comprising:
heating an aluminum material including aluminum as a primary component and scandium as a secondary component to a solutionizing temperature of the aluminum material for a period of time to disperse the scandium throughout the aluminum material to form an aluminum alloy; and
extruding the aluminum alloy with equal channel angular extrusion to form a high strength aluminum alloy, such that the high strength aluminum alloy has a yield strength greater than 40 ksi and an average grain size less than 1.0 micron in diameter after being at a temperature from about 300° C. to about 400° C. for at least one hour.

2. The method of claim 1, wherein the scandium forms dispersoids throughout the aluminum alloy.

3. The method of claim 1, wherein scandium is present in the aluminum alloy at a weight percentage from about 0.1 wt. % to about 15.0 wt. %.

4. The method of claim 1, wherein scandium is present in the aluminum alloy at a weight percentage from about 0.1 wt. % to about 5.0 wt. %.

5. The method of claim 1, wherein scandium is present in the aluminum alloy at a weight percentage from about 0.1 wt. % to about 5.0 wt. % and wherein the aluminum alloy further comprises zirconium at a weight percentage from about 0.1 wt. % to about 5.0 wt. %.

6. The method of claim 1, further comprising aging the high strength aluminum alloy at a temperature from about 300° C. to about 400° C. for at least one hour such that at least a portion of the scandium forms dispersoids throughout the high strength aluminum alloy.

7. The method of claim 1, wherein heating the aluminum material further comprises heating an aluminum material including scandium and at least one member of the group consisting of oxides, carbides, nanotubes, silicides, fullerenes, chromium, iron, hafnium, manganese, niobium, nickel, titanium, vanadium, yttrium, lithium, tantalum, molybdenum, lanthanum, cerium, praseodymium, neodymium, promethium, samarium, europium, gadolinium, terbium, dysprosium, holmium, erbium, thulium, ytterbium, and lutetium.

8. The method of claim 1, wherein heating the aluminum material further comprises heating an aluminum material including scandium and a second material that forms a dispersoid throughout the aluminum alloy, the second material selected from the group consisting of oxides, carbides, nanotubes, silicides, fullerenes, chromium, iron, hafnium, manganese, niobium, nickel, titanium, vanadium, yttrium, lithium, tantalum, molybdenum, lanthanum, cerium, praseodymium, neodymium, promethium, samarium, europium, gadolinium, terbium, dysprosium, holmium, erbium, thulium, ytterbium, and lutetium, and a third material present throughout the aluminum alloy, the third material selected from the group consisting of magnesium, manganese, silicon, copper, nickel, molybdenum, chromium, zinc, lithium, vanadium, iron, boron, zirconium, bismuth, and lead.

9. The method of claim 1, wherein extruding the aluminum alloy comprises at least four passes of equal channel angular extrusion.

10. The method of claim 1, wherein the high strength aluminum alloy has an average grain size smaller than 1.0 micron in diameter after the high strength aluminum alloy has been at a temperature from about 300° C. to about 400° C. for at least one hour.

11. The method of claim 1, wherein the high strength aluminum alloy has a yield strength greater than 40 ksi after being at a temperature from about 300° C. to about 400° C. for at least two hours.

12. The method of claim 1, wherein the high strength aluminum alloy has a yield strength greater than 40 ksi after being at a temperature from about 350° C. to about 400° C. for at least one hour.

13. A method of forming an aluminum alloy for use in a sputtering assembly backing plate, the method comprising:
adding scandium to molten aluminum to form an aluminum material;
casting the aluminum material;
heating the aluminum material to a temperature from about 500° C. to about 650° C. for from about 8 hours to about 120 hours, such that at least a portion of the scandium is dissolved throughout the aluminum material to form an aluminum alloy;
quenching the aluminum alloy, such that the scandium remains dissolved throughout the aluminum alloy;
subjecting the aluminum alloy to equal channel angular extrusion to form a high strength aluminum alloy; and
aging the high strength aluminum alloy at a temperature from about 300° C. to about 400° C. for at least one hour so that at least a portion of the scandium forms dispersoids throughout the high strength aluminum alloy,
wherein the high strength aluminum alloy has a yield strength greater than 40 ksi and an average grain size less than 1.0 micron in diameter after being at a temperature from about 300° C. to about 400° C. for at least one hour.

14. A sputtering assembly comprising:
a target; and
a backing plate comprising an aluminum alloy, the aluminum alloy comprising:
an aluminum material forming a metal matrix with aluminum as a primary component and containing scandium as a secondary component present at a weight percentage from about 0.1 wt. % to about 15.0 wt. % by weight of the aluminum alloy;
wherein at least a portion of the scandium forms dispersoids that are distributed throughout the aluminum alloy;
wherein the aluminum alloy has a yield strength greater than about 40 ksi and an average grain size less than 1.0 micron in diameter after the aluminum alloy has been at a temperature from about 300° C. to about 400° C. for at least one hour.

15. The sputtering assembly of claim 14, wherein the aluminum alloy includes scandium at a weight percentage from about 0.1 wt. % to about 5.0 wt. % and wherein the aluminum alloy further includes zirconium at a weight percentage from about 0.1 wt. % to about 5.0 wt. %.

16. The sputtering assembly of claim 14, wherein the aluminum alloy includes a second dispersoid throughout the aluminum alloy, the second dispersoid is formed of the aluminum material in combination with a second material, wherein the second material is at least one member of the group consisting of oxides, carbides, nanotubes, silicides, fullerenes, iron, hafnium, manganese, niobium, nickel, titanium, vanadium, yttrium, lithium, tantalum, molybdenum, lanthanum, cerium, praseodymium, neodymium, promethium, samarium, europium, gadolinium, terbium, dysprosium, holmium, erbium, thulium, ytterbium, and lutetium.

17. The sputtering assembly of claim 14, wherein the aluminum alloy includes a second dispersoid throughout the aluminum alloy, the second dispersoid is formed of the aluminum material in combination with a second material, wherein the second material is at least one member of the group consisting of oxides, carbides, nanotubes, silicides, fullerenes, chromium, iron, hafnium, manganese, niobium, nickel, titanium, vanadium, yttrium, lithium, tantalum, molybdenum, lanthanum, cerium, praseodymium, neodymium, promethium, samarium, europium, gadolinium, terbium, dysprosium, holmium, erbium, thulium, ytterbium, and lutetium, and a third material present throughout the aluminum alloy, the third material selected from the group consisting of magnesium, manganese, silicon, copper, nickel, molybdenum, chromium, zinc, lithium, vanadium, iron, boron, zirconium, bismuth, and lead.

18. The sputtering assembly of claim 14, wherein the aluminum alloy at room temperature has a yield strength of at least 40 ksi after the aluminum alloy has been at a temperature from about 300° C. to about 400° C. for at least two hours.

19. The sputtering assembly of claim 14, wherein the aluminum alloy at room temperature has a yield strength of at least 40 ksi after the aluminum alloy has been at a temperature from about 350° C. to about 400° C. for at least one hour.

* * * * *